United States Patent
Tanaka et al.

(10) Patent No.: US 8,188,530 B2
(45) Date of Patent: May 29, 2012

(54) NONVOLATILE SEMICONDUCTOR MEMORY DEVICE AND METHOD FOR MANUFACTURING SAME

(75) Inventors: Hiroyasu Tanaka, Tokyo (JP); Ryota Katsumata, Kanagawa-ken (JP); Hideaki Aochi, Kanagawa-ken (JP); Masaru Kito, Kanagawa-ken (JP); Yoshiaki Fukuzumi, Kanagawa-ken (JP); Masaru Kidoh, Tokyo (JP); Yosuke Komori, Kanagawa-ken (JP); Megumi Ishiduki, Kanagawa-ken (JP); Junya Matsunami, Kanagawa-ken (JP); Tomoko Fujiwara, Kanagawa-ken (JP); Ryouhei Kirisawa, Kanagawa-ken (JP); Yoshimasa Mikajiri, Kanagawa-ken (JP); Shigeto Oota, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 12/728,727

(22) Filed: Mar. 22, 2010

(65) Prior Publication Data
US 2010/0327339 A1 Dec. 30, 2010

(30) Foreign Application Priority Data
Jun. 24, 2009 (JP) ................................. 2009-149399

(51) Int. Cl.
*H01L 21/8239* (2006.01)
*H01L 29/78* (2006.01)
*H01L 27/088* (2006.01)

(52) U.S. Cl. ... 257/314; 257/390; 257/392; 257/E21.66; 257/E21.68; 257/E21.691; 438/275

(58) Field of Classification Search .................. 257/314, 257/390, 392, E21.66, E21.68, E21.691; 438/275
See application file for complete search history.

(56) References Cited

U.S. PATENT DOCUMENTS 6,870,215 B2 3/2005 Endoh et al.
2007/0252201 A1 11/2007 Kito et al.

FOREIGN PATENT DOCUMENTS

JP 2007-266143 10/2007
WO WO 2009/075370 A1 6/2009

*Primary Examiner* — Evan Pert
(74) *Attorney, Agent, or Firm* — Oblon, Spivak, McClelland, Maier & Neustadt, L.L.P.

(57) ABSTRACT

A semiconductor memory device provided with a cell array section and a peripheral circuit section, the device includes: a back gate electrode; a stacked body provided on the back gate electrode; a plurality of semiconductor pillars extending in a stacking direction; connection members, each of the connection members connecting one of the semiconductor pillars to another one of the semiconductor pillars; a back-gate electrode contact applying a potential to the back gate electrode; a gate electrode provided in the peripheral circuit section; and a gate electrode contact applying a potential to the gate electrode, the back gate electrode and the gate electrode respectively including: a lower semiconductor layer; a conductive layer provided on the lower semiconductor layer; and an upper semiconductor layer provided on the conductive layer, the connection members being provided in or on the upper semiconductor layer, the back-gate electrode contact and the gate electrode contact being in contact with the conductive layer.

15 Claims, 23 Drawing Sheets

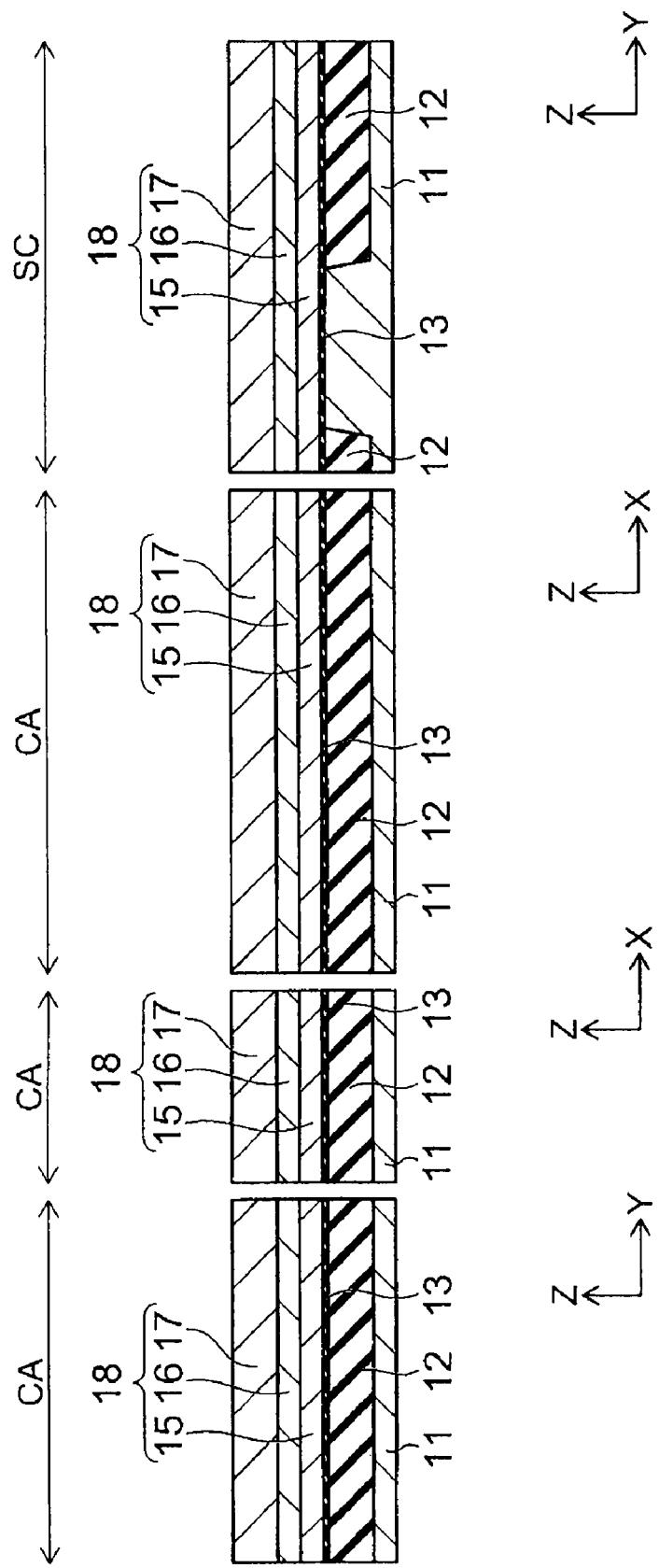

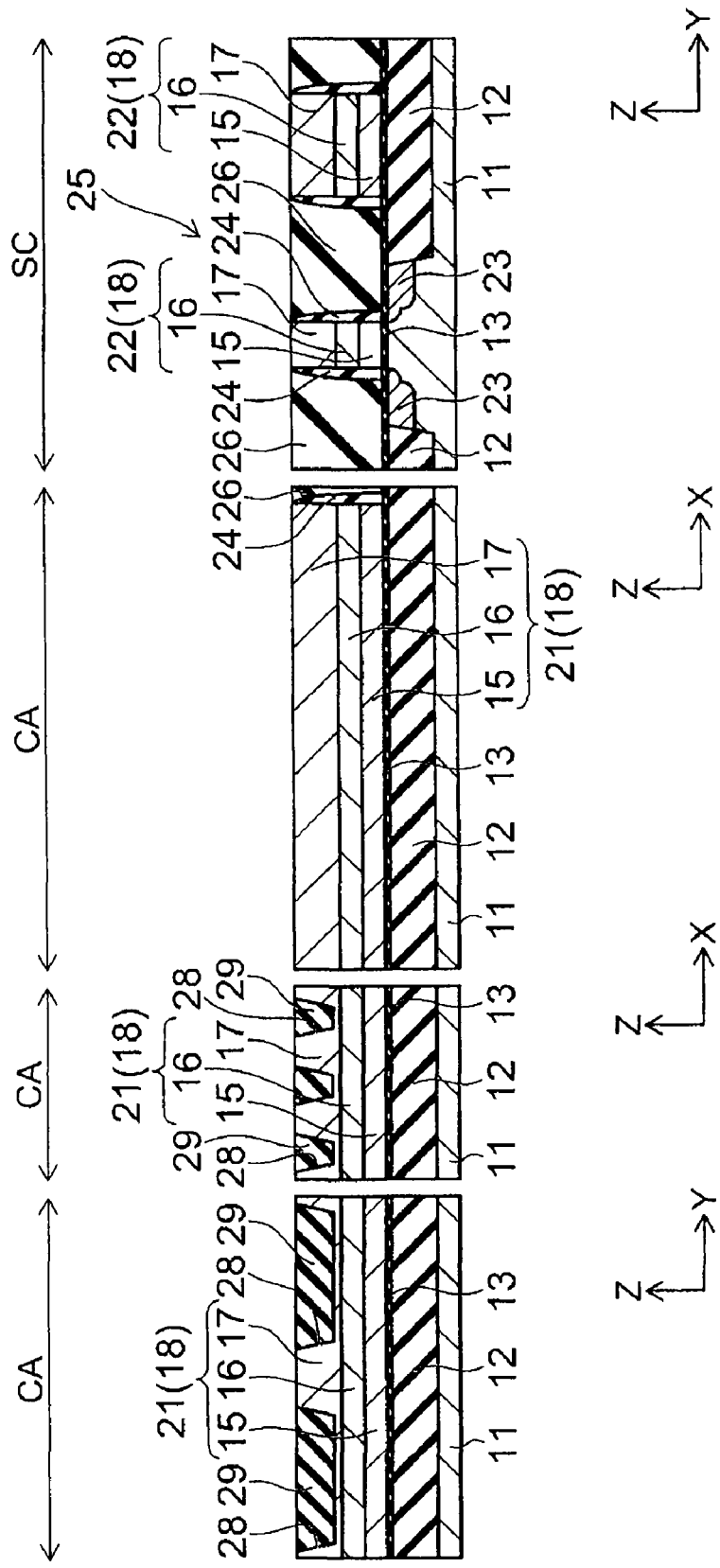

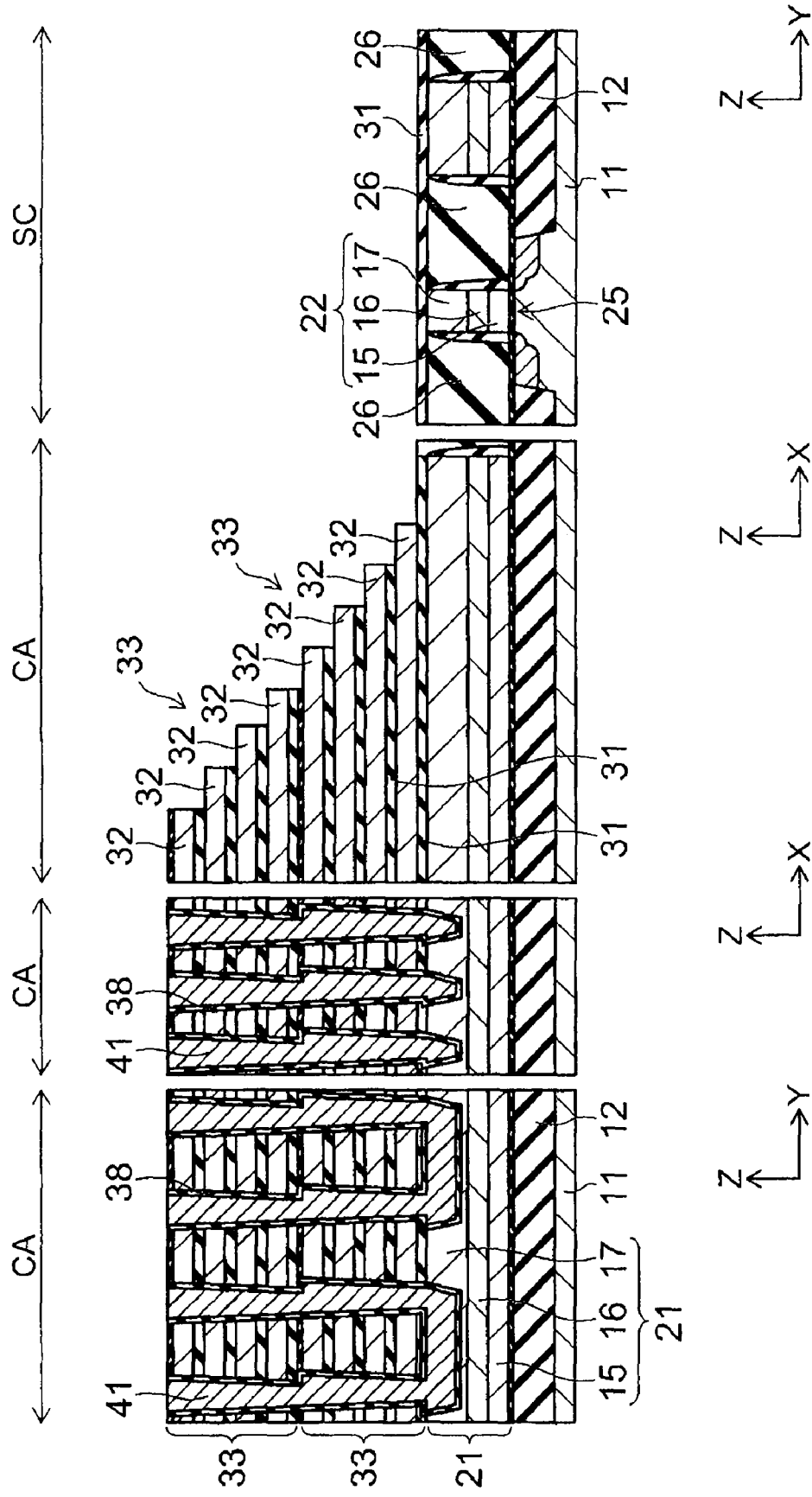

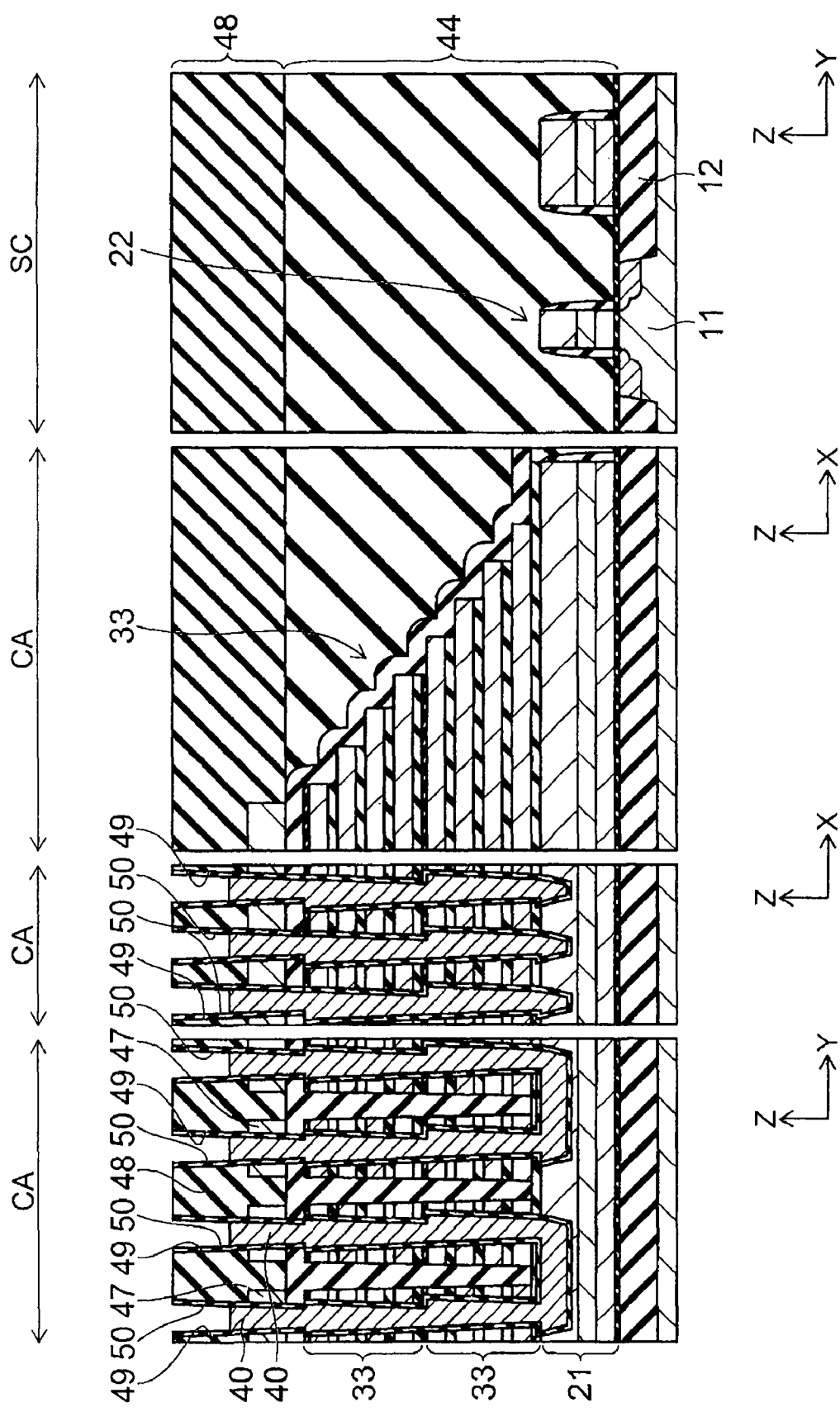

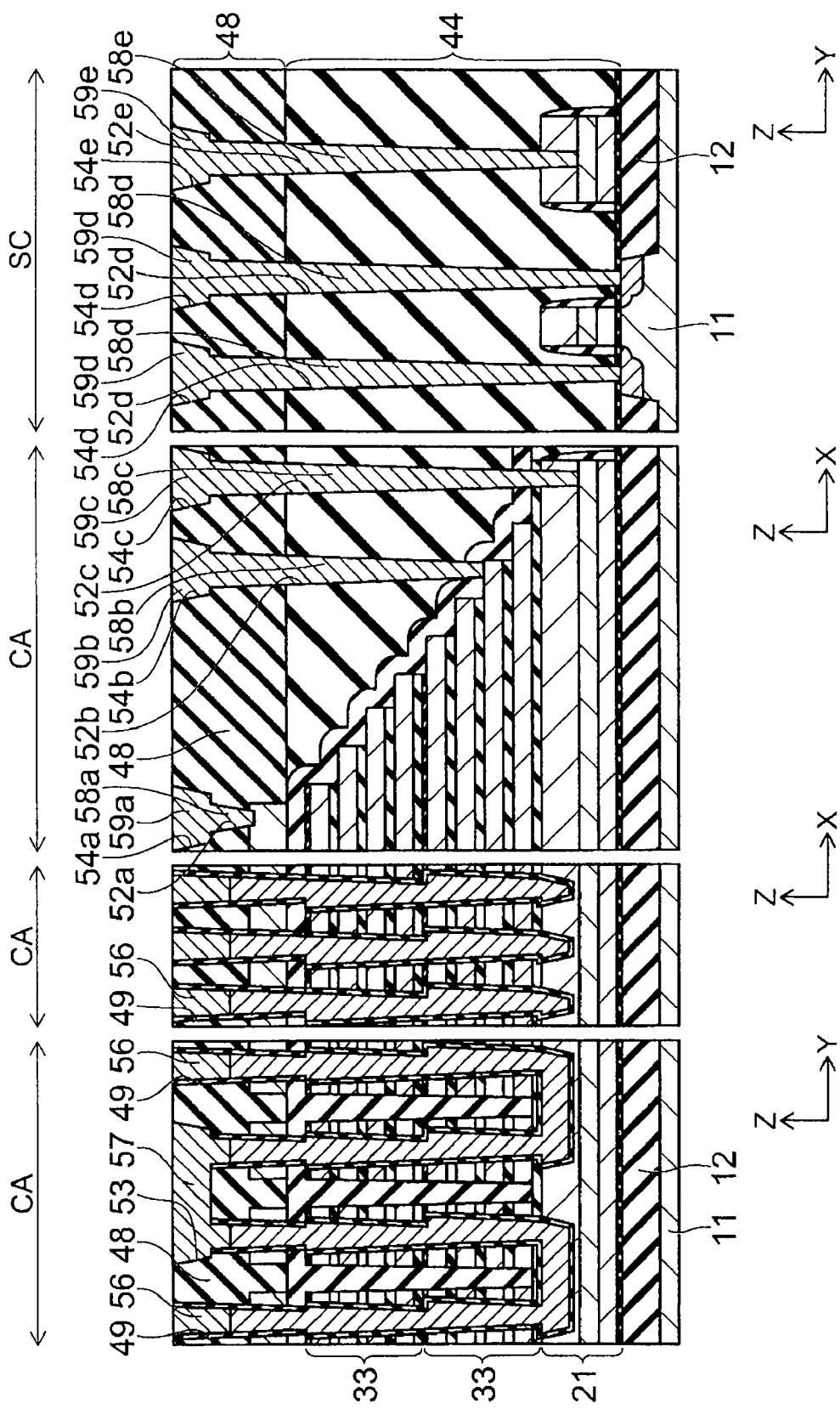

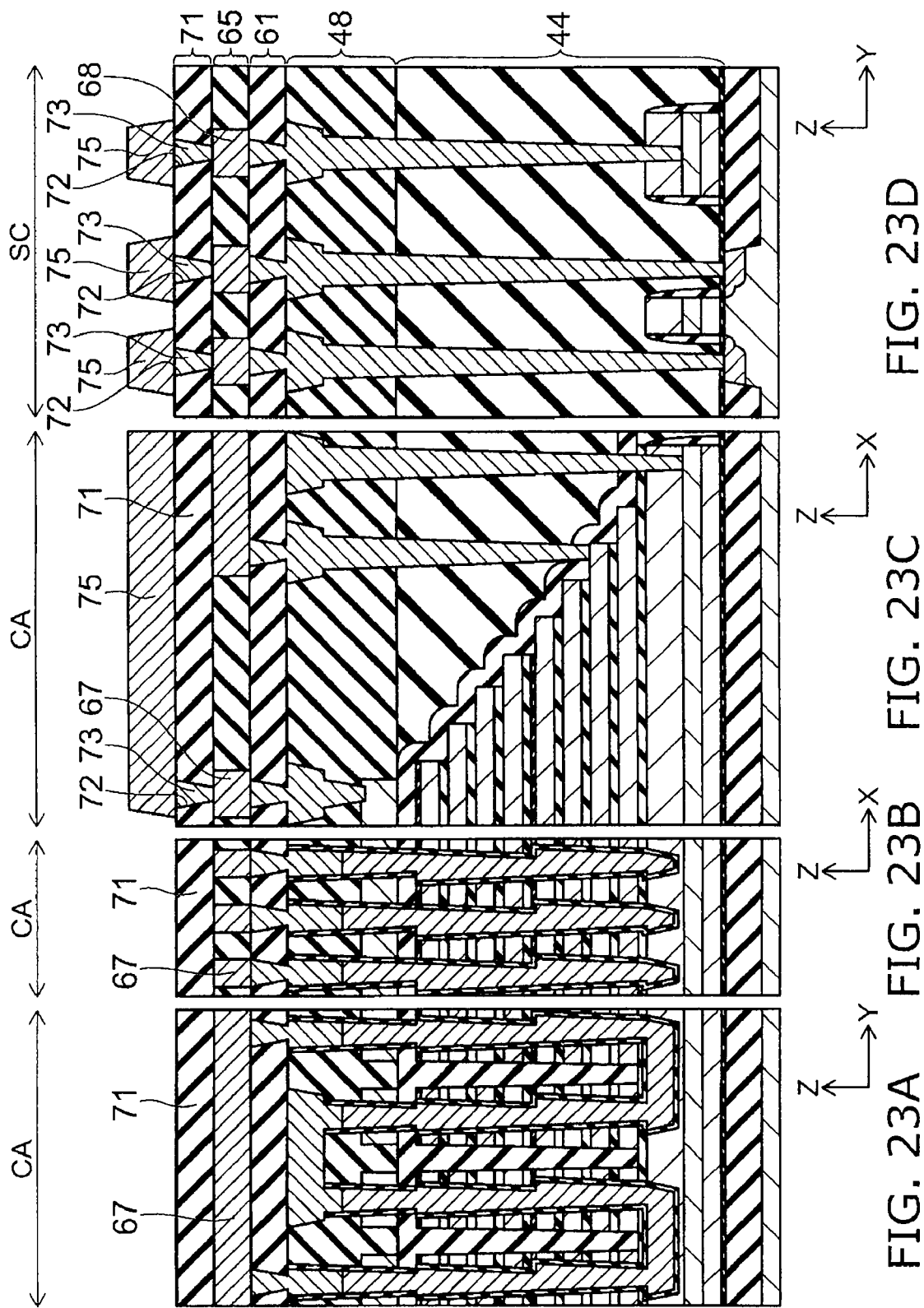

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-149399, filed on Jun. 24, 2009; the entire contents of which are incorporated herein by reference.

BACKGROUND

1. Field

Embodiments of the invention relate generally to a nonvolatile semiconductor memory device that can electrically rewrite data and a method for manufacturing the same.

2. Background Art

Conventionally, semiconductor memory devices, such as flash memories, have been fabricated by two-dimensionally integrating memory cells on the surface of a silicon substrate. In this type of semiconductor memory device, increase in the packaging density of memory cells is required to reduce cost per bit and increase memory capacity. However, recently, such increase in the packaging density has been difficult in terms of cost and technology.

Methods of stacking memory cells for three-dimensional integration are known as techniques for breaking through the limit of packaging density. However, in the method of simply stacking and patterning layer by layer, increase in the number of stacked layers results in increasing the number of processes and increasing cost. In particular, increase in the number of lithography processes for patterning the structure of a transistor is a primary factor in increased cost. Thus, reduction in chip area per bit by layer stacking is not so effective in reducing cost per bit as downscaling in the chip surface, and is not suitable as a method for increasing memory capacity.

In consideration of such problems, the inventors, etc. proposed a simultaneously patterned three-dimensional stacked memory (for example, refer to JP-A 2007-266143 (Kokai)). In this technique, a stacked body is formed on a silicon substrate by alternately stacking electrode films and insulating films and subsequently making through-holes in the stacked body by collective patterning. A charge storage layer is formed on the side surface of the through-hole, and the through-hole is filled with a silicon pillar. Thus, a memory transistor is formed at an intersection between each electrode films and the silicon pillar.

In this simultaneously patterned three-dimensional stacked memory, information can be stored by controlling the potential of each electrode film and each silicon pillar to transfer charge between the silicon pillar and the charge storage layer. In this technique, through holes are formed by simultaneously patterning the stacked body. Hence, increase in the number of stacked electrode films does not result in increasing the number of lithography processes, and cost increase can be suppressed.

In such a simultaneously patterned three-dimensional stacked memory, a cell array section having three-dimensionally arranged memory transistors and a peripheral circuit section for driving the cell array section are provided and the peripheral circuit section applies a control potential to the cell array section through an interconnect. Moreover, when such simultaneously patterned three-dimensional stacked memory is fabricated, it is preferred that an electrode in a lower portion of the cell array section is formed simultaneously with the gate electrode of a MOSFET (Metal-Oxide-Semiconductor Field-Effect Transistor) provided in the peripheral circuit section for simplification of manufacturing process. In this case, the gate electrode of the MOSFET is typically formed of a semiconductor material doped with impurities, and thus it follows that the electrode in the lower portion of the cell array section is also formed of the semiconductor material doped with impurities. This disadvantageously results in increasing the resistance of the electrode.

SUMMARY

According to an aspect of the invention, there is provided a semiconductor memory device provided with a cell array section and a peripheral circuit section, the device including: a semiconductor substrate; an insulating film provided on the semiconductor substrate in the cell array section; a back gate electrode provided on the insulating film; a stacked body provided on the back gate electrode and including a plurality of insulating films and electrode films alternately stacked; a plurality of semiconductor pillars extending in a stacking direction of the insulating films and the electrode films of the stacked body and piercing the stacked body; connection members provided in or on the back gate electrode, each of the connection members connecting a lower end of one of the semiconductor pillars to a lower end of another one of the semiconductor pillars; charge storage layers provided between the electrode films and the semiconductor pillars and between the back gate electrode and the connection members; a back-gate electrode contact applying a potential to the back gate electrode; a pair of source/drain regions formed apart from each other in an upper layer portion of the semiconductor substrate in the peripheral circuit section; a gate insulating film provided immediately above a region between the source/drain regions on the semiconductor substrate; a gate electrode provided on the gate insulating film; and a gate electrode contact applying a potential to the gate electrode, the back gate electrode and the gate electrode respectively including: a lower semiconductor layer; a conductive layer provided on the lower semiconductor layer; and an upper semiconductor layer provided on the conductive layer, the connection members being provided in or on the upper semiconductor layer, the back-gate electrode contact and the gate electrode contact being in contact with the conductive layer.

According to another aspect of the invention, there is provided a method for manufacturing a semiconductor memory device provided with a cell array section and a peripheral circuit section, the method including: forming an insulating film on a semiconductor substrate; forming a conductive film including a lower semiconductor layer, a conductive layer, and an upper semiconductor layer being stacked in this order on the insulating film; processing the conductive film to form a back gate electrode in the cell array section and a gate electrode in the peripheral circuit section; forming source/drain regions in regions of the both sides of a region immediately below the gate electrode of the semiconductor substrate; forming a plurality of recesses in an upper surface of the upper semiconductor layer formed in the cell array section; filling sacrificial members in the recesses; forming a stacked body by alternatively stacking a plurality of insulating films and electrode films on the back gate electrode; forming through-holes extending in a stacking direction of the insulating films and the electrode films of the stacked body, two of the through-holes reaching each of the sacrificial members; removing the sacrificial members by etching via the through-holes; forming charge storage layers on inner surface of the through-holes and inner surfaces of the recesses; filling semiconductor material inside the through-holes and the recesses to form connection members in the recesses and semiconductor pillars in the through-holes; and forming a back-gate electrode contact reaching the conductive layer of the back gate electrode and a gate electrode contact reaching the conductive layer of the gate electrode.

BRIEF DESCRIPTION OF THE DRAWINGS

FIG. 1A shows a cross section of a cell array section along a bit line, FIG. 1B shows a cross section of the cell array section along a source line, FIG. 1C shows the end of the cell array section, and FIG. 1D shows a peripheral circuit section;

FIGS. 4A to 4D are process cross-sectional views illustrating a method for manufacturing a semiconductor memory device according to the embodiment, FIG. 4A shows a cross section of a cell array section along a bit line, FIG. 4B shows a cross section of the cell array section along a source line, FIG. 4C shows the end of the cell array section, and FIG. 4D shows a peripheral circuit section; and FIGS. 5A to 23D are process cross-sectional views illustrating the method for manufacturing the semiconductor memory device according to the embodiment.

DETAILED DESCRIPTION

An embodiment of the invention will now be described with reference to the drawings.

Figure 1:
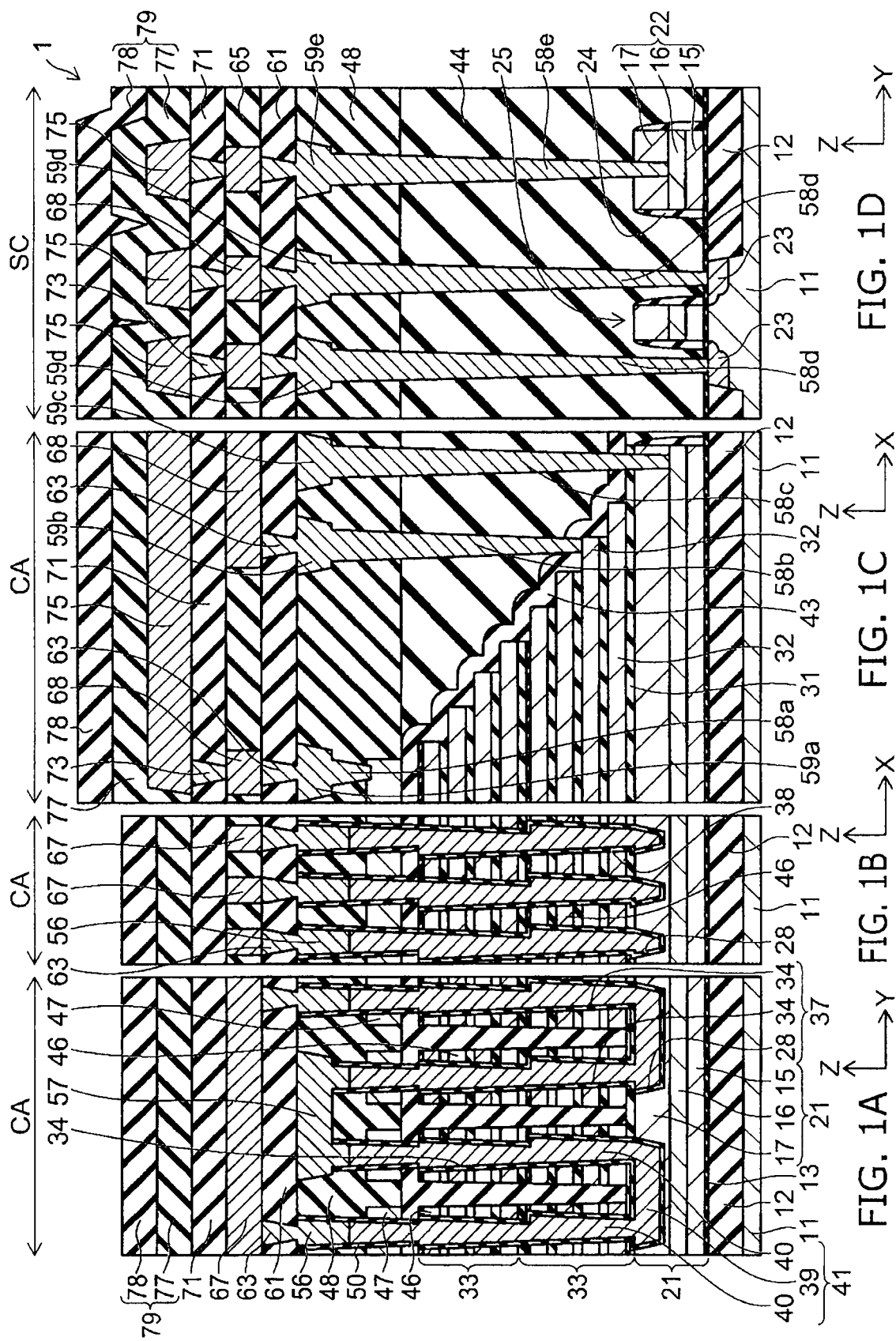
FIGS. 1A to 1D are cross-sectional views illustrating a semiconductor memory device according to an embodiment of the invention.

FIGS. 1A to 1D are cross-sectional views illustrating a semiconductor memory device according to this embodiment, FIG. 1A shows a cross section of a cell array section along a bit line, FIG. 1B shows a cross section of the cell array section along a source line, FIG. 1C shows the end of the cell array section, and FIG. 1D shows a peripheral circuit section.

Figure 2:
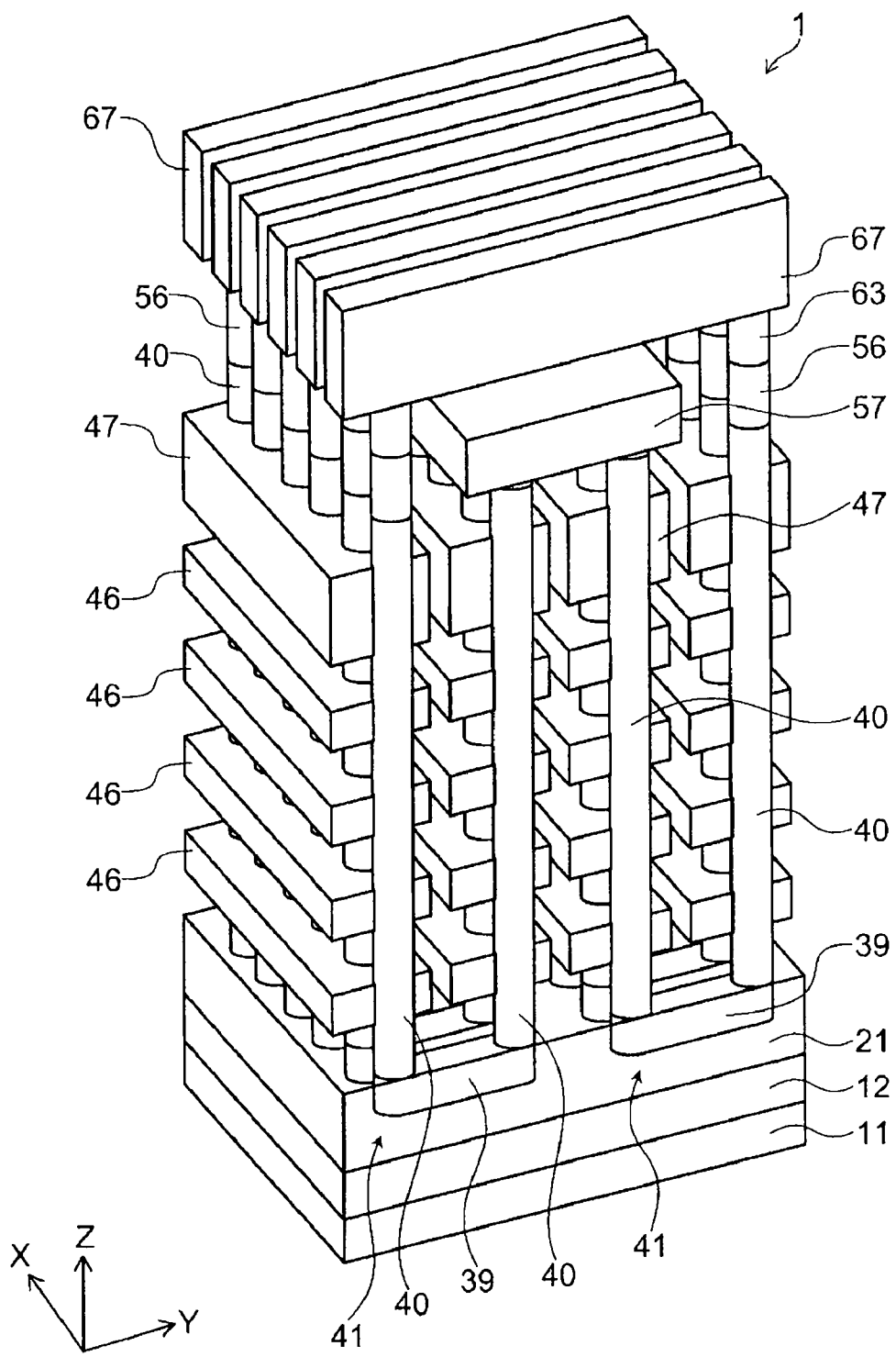
FIG. 2 is a perspective view illustrating the cell array section of the semiconductor memory device according to the embodiment.

FIG. 2 is a perspective view illustrating the cell array section of the semiconductor memory device according to this embodiment.

Figure 3A:
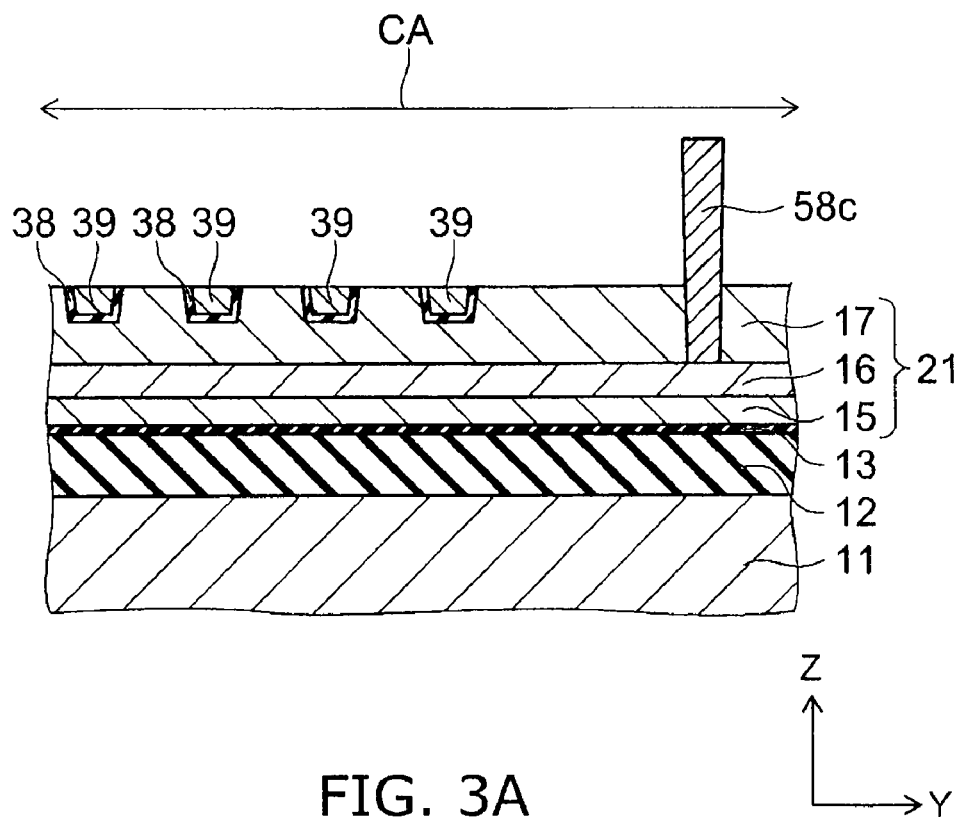
FIG. 3A is a cross-sectional view illustrating a back gate electrode of the cell array section.
Figure 3B:
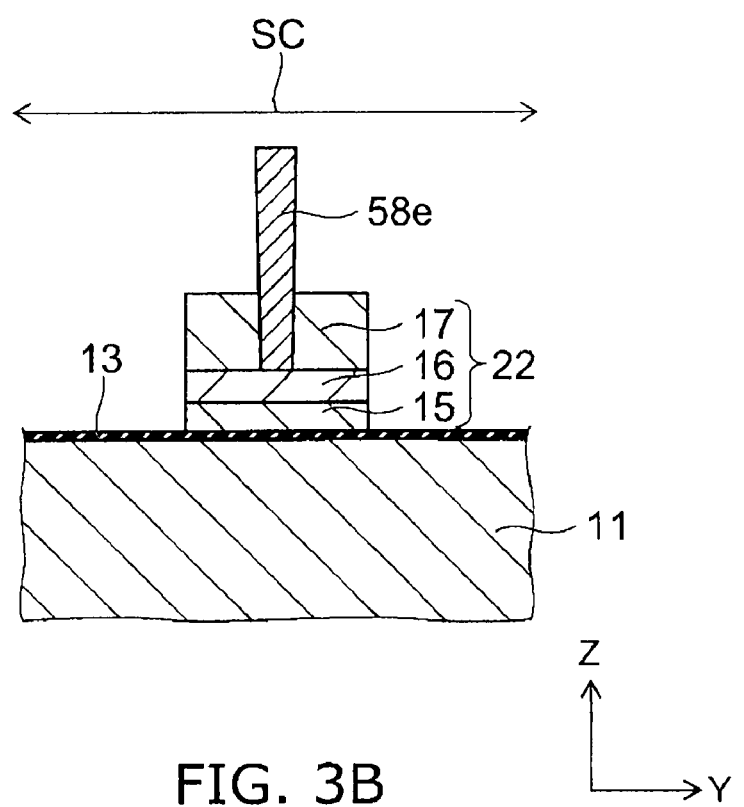
FIG. 3B is a cross-sectional view illustrating a gate electrode of a transistor of the peripheral circuit section.
Figures 6A, 6B, 6C, 6D:
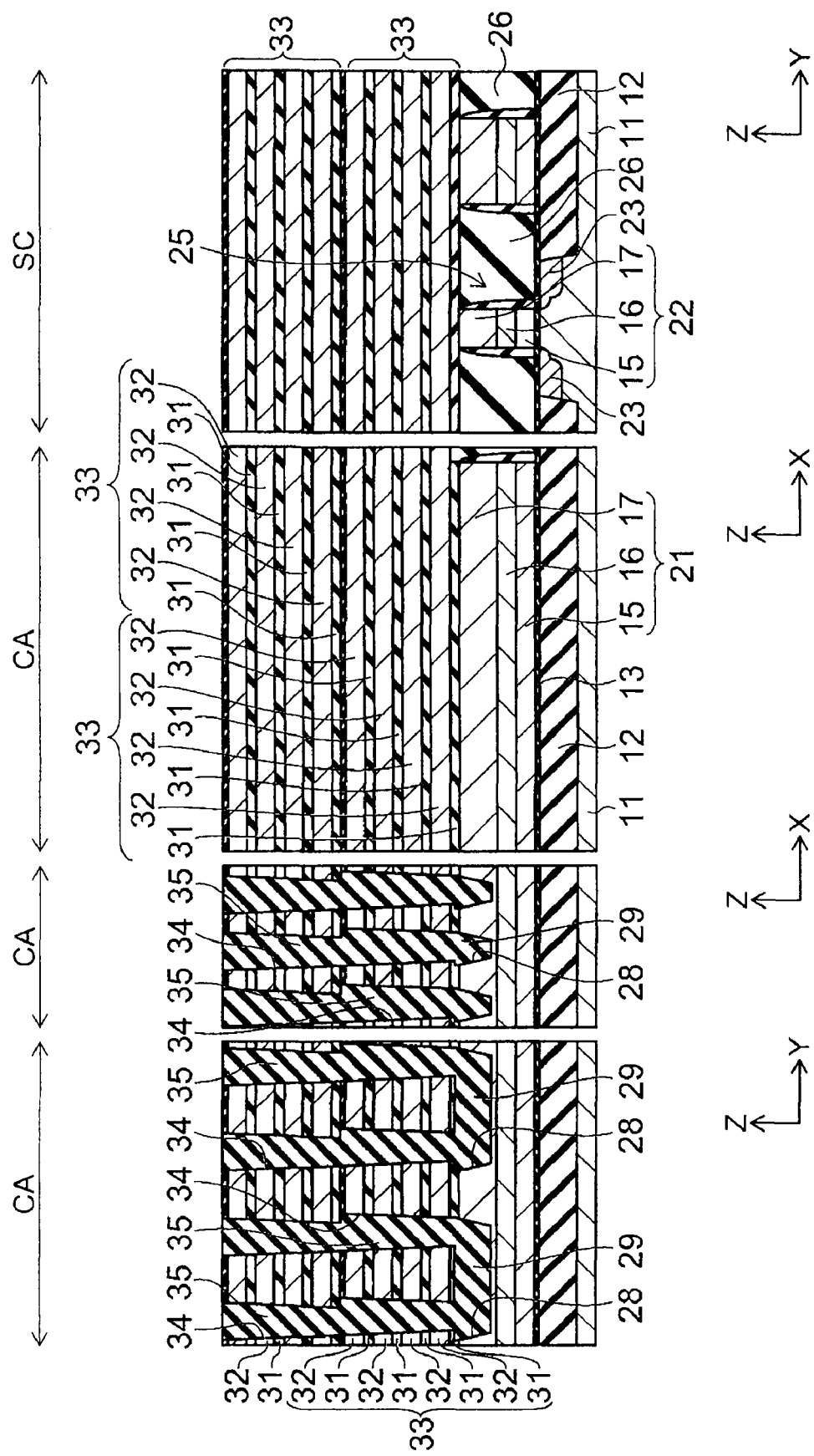
Figures 7A, 7B, 7C, 7D:
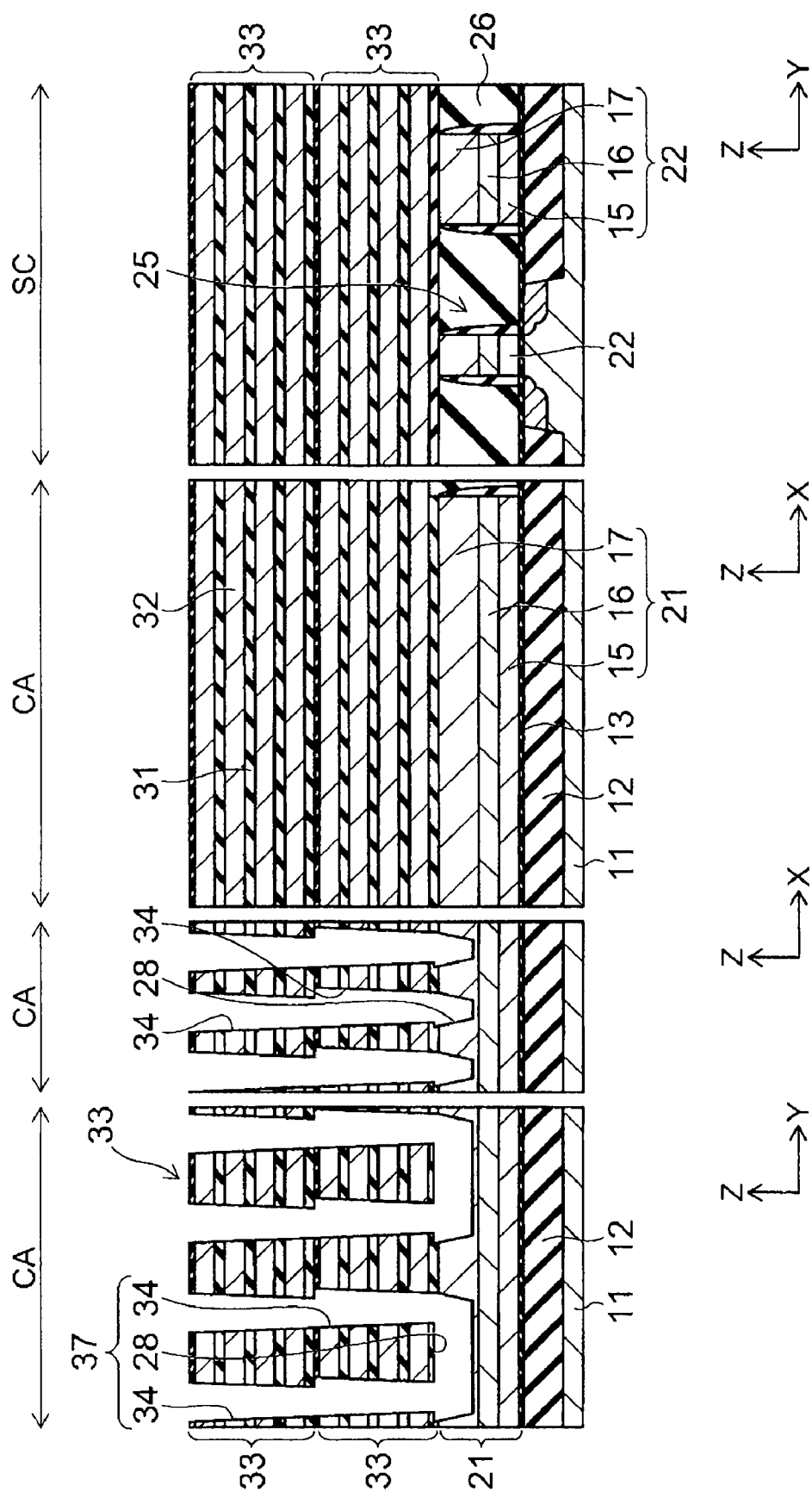
Figures 8A, 8B, 8C, 8D:
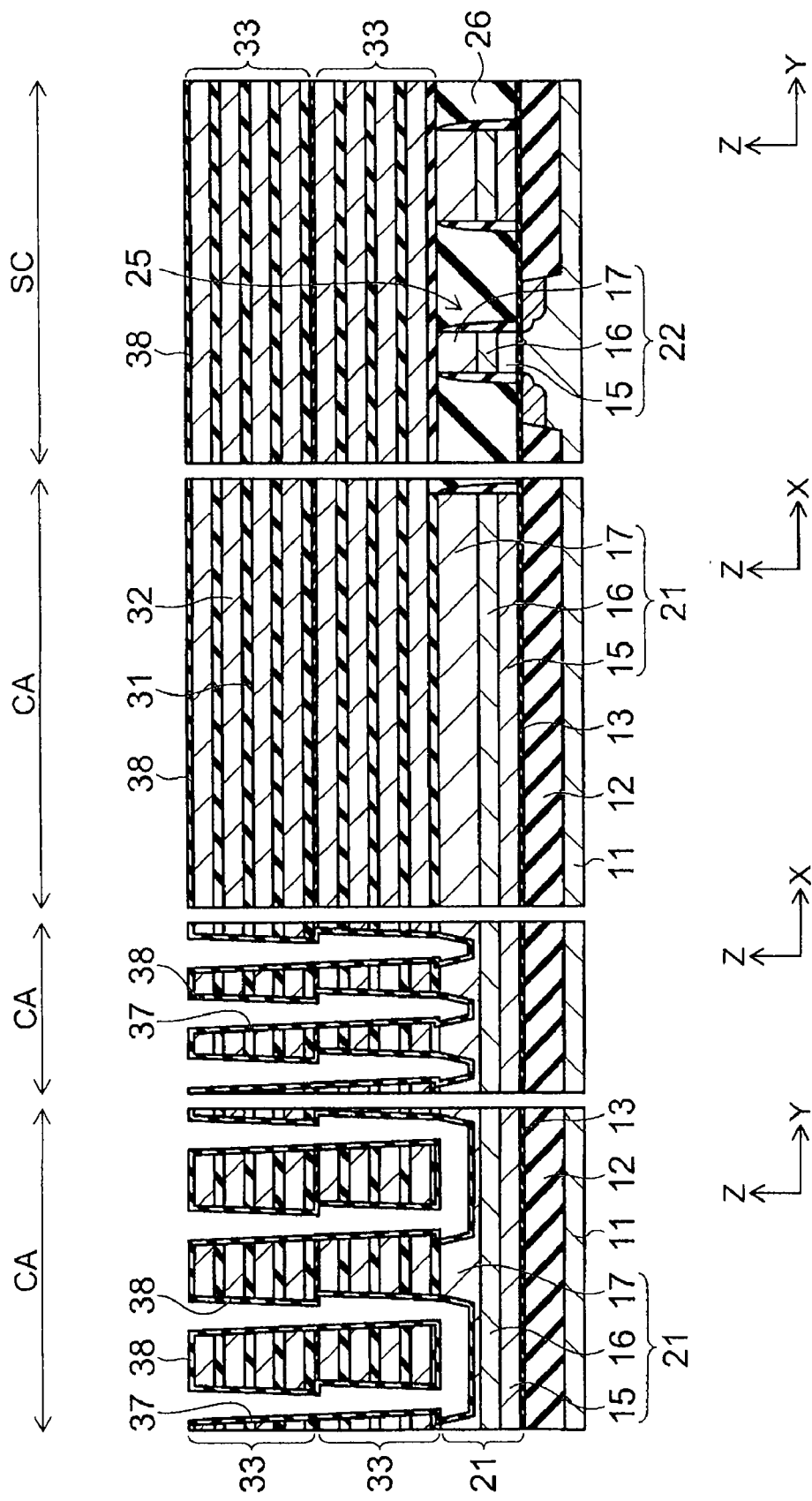
Figures 9A, 9B, 9C, 9D:
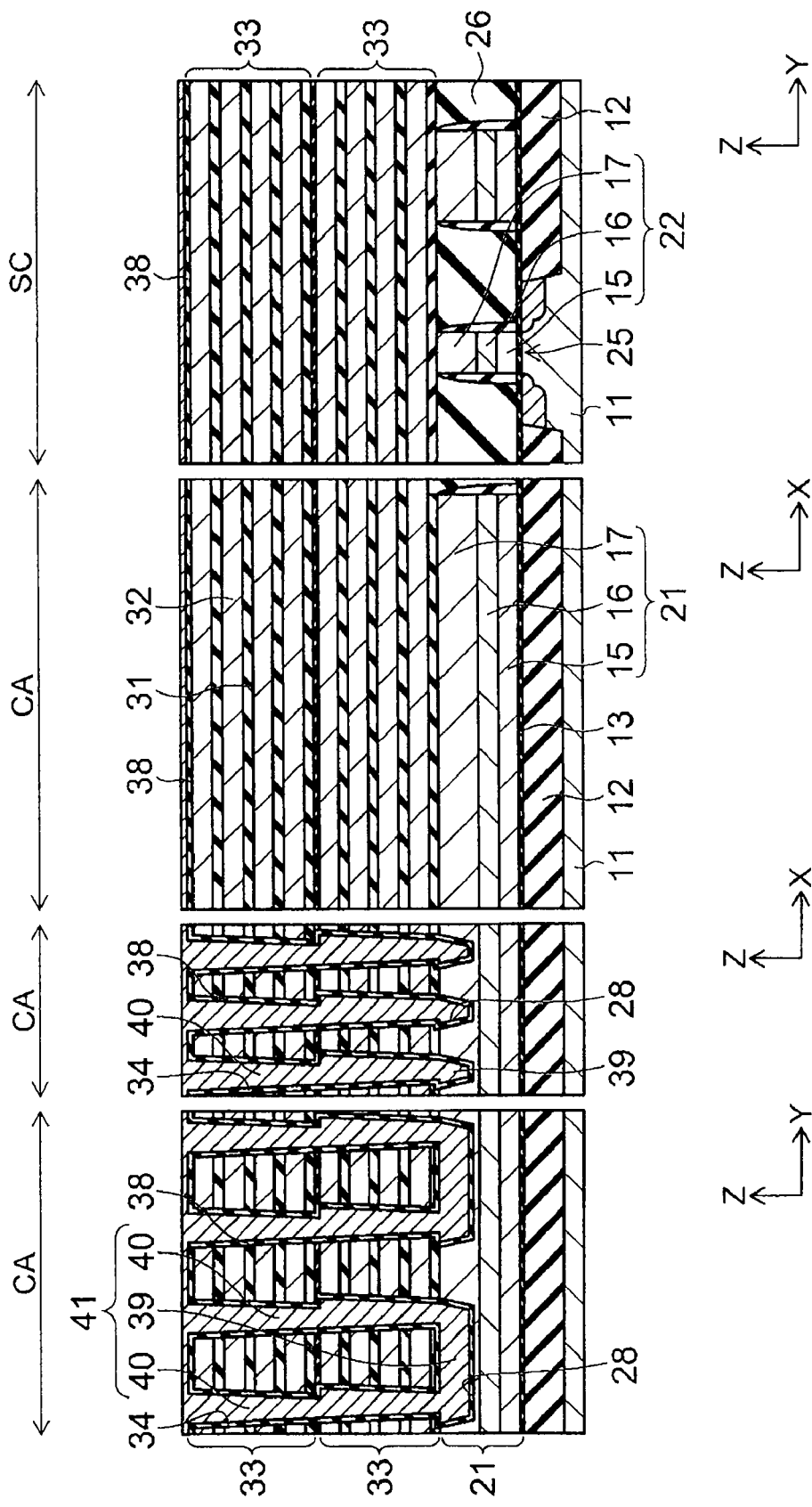
Figures 10A, 10B, 10C, 10D:
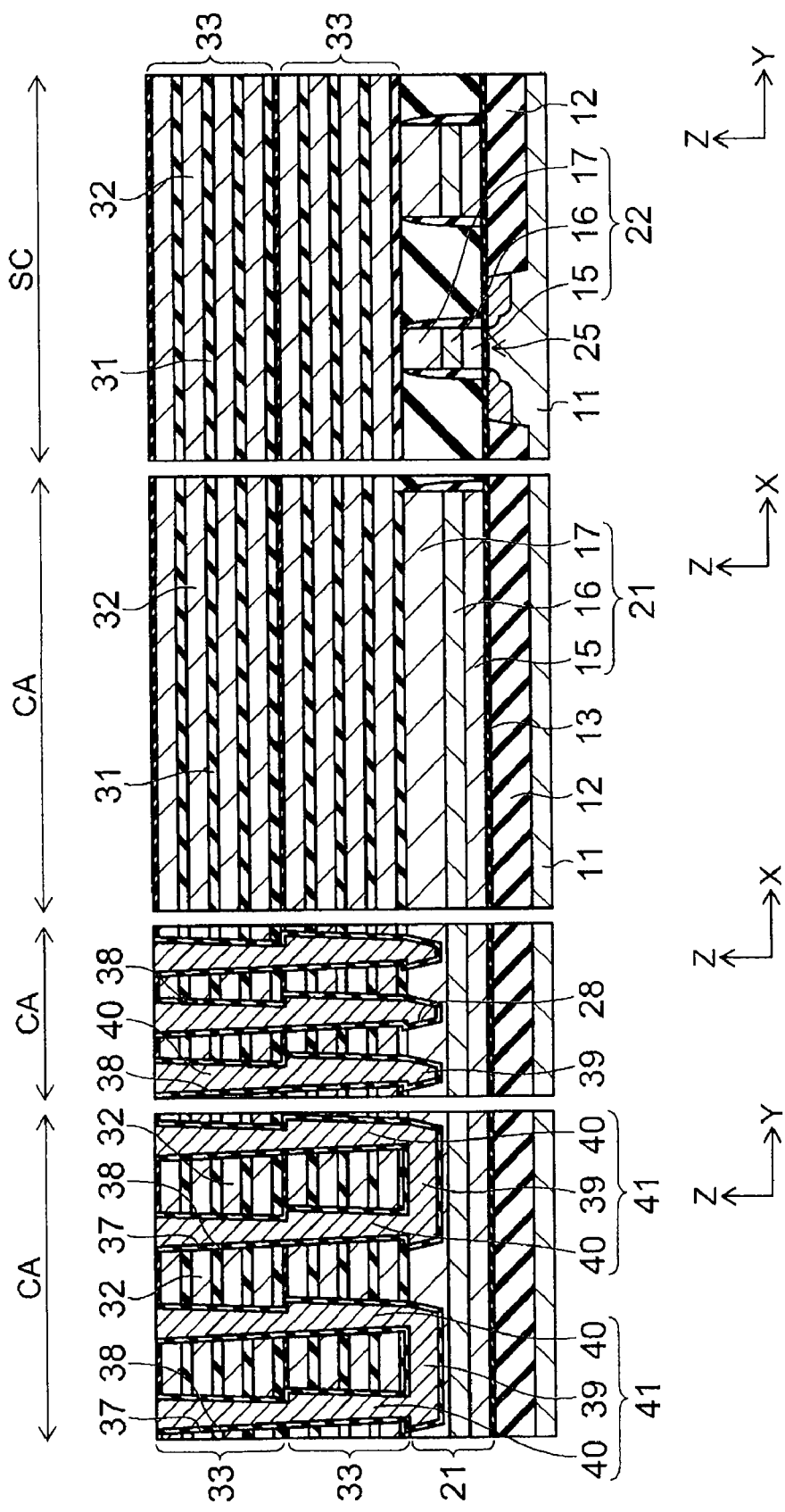
Figures 12A, 12B, 12C, 12D:
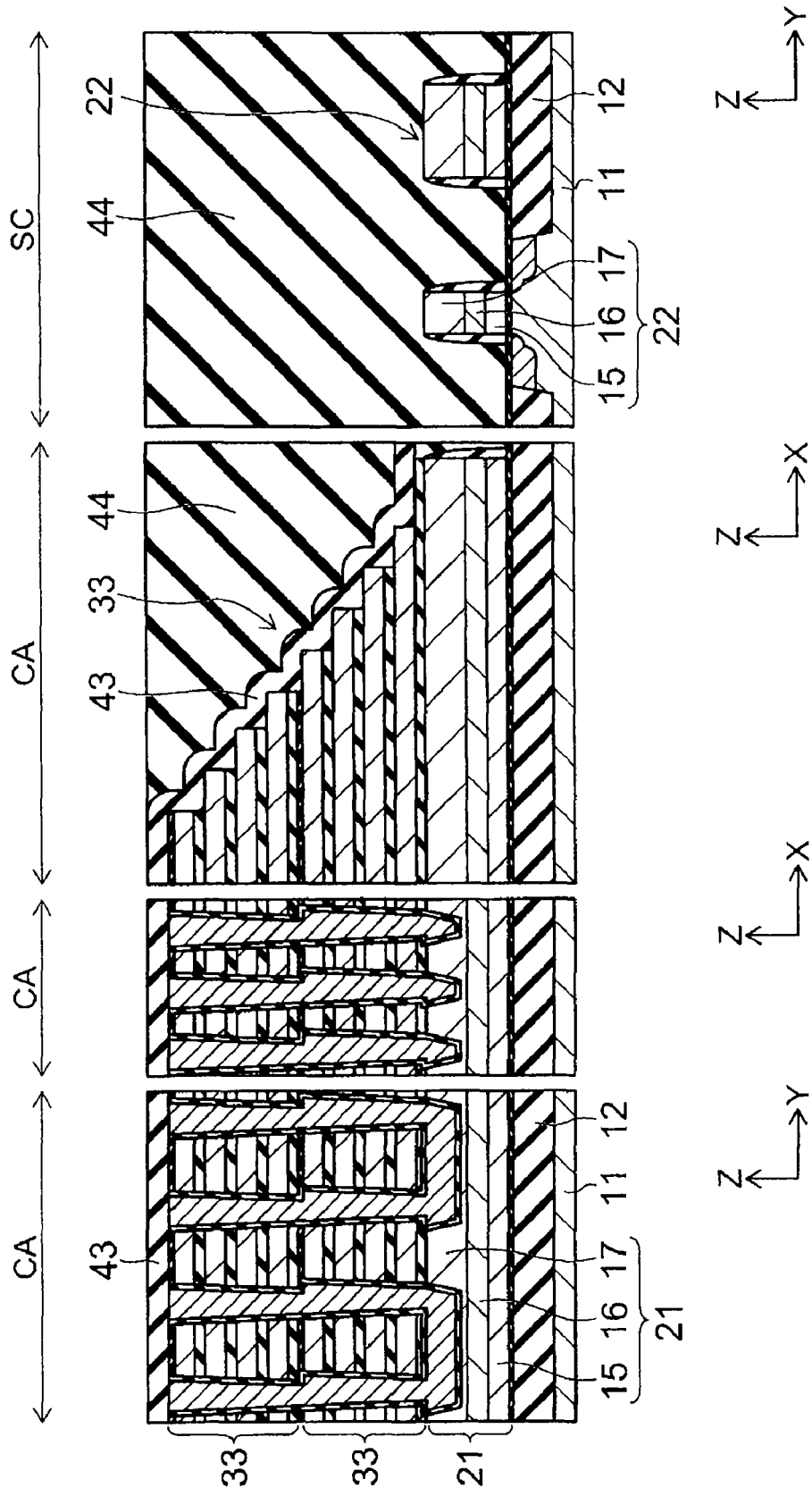
Figures 13A, 13B, 13C, 13D:
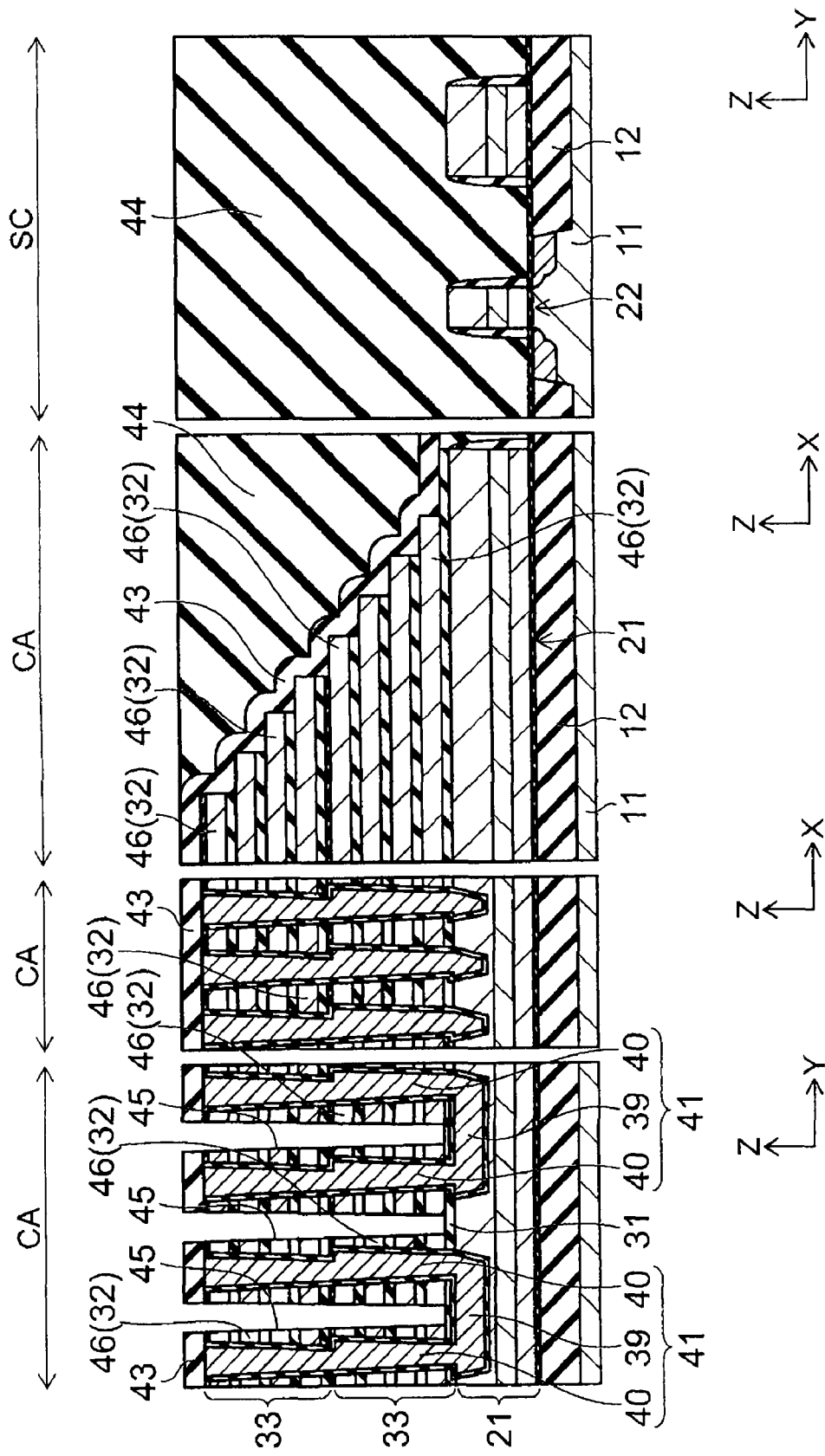
Figures 14A, 14B, 14C, 14D:
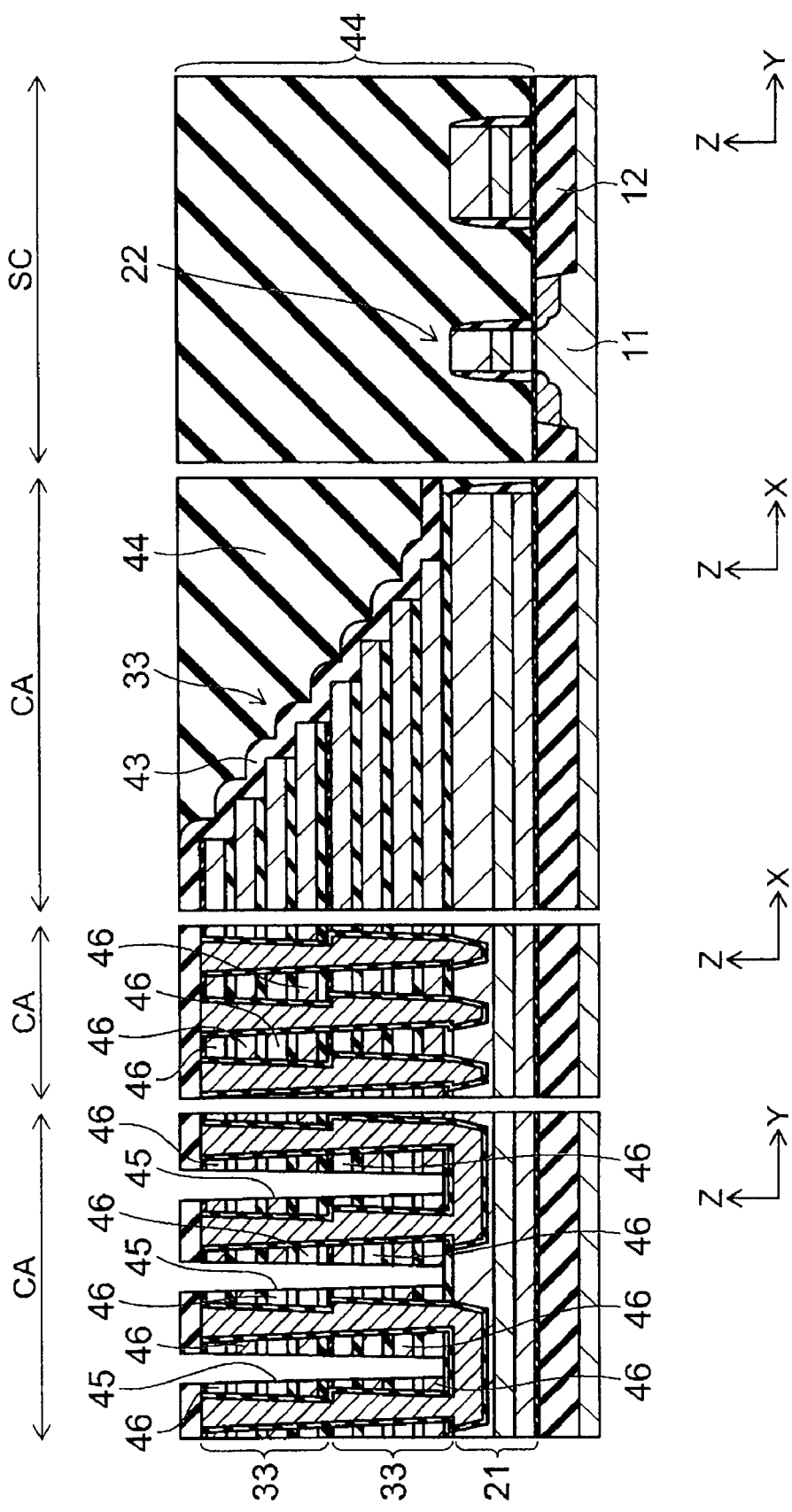
Figures 15A, 15B, 15C, 15D:
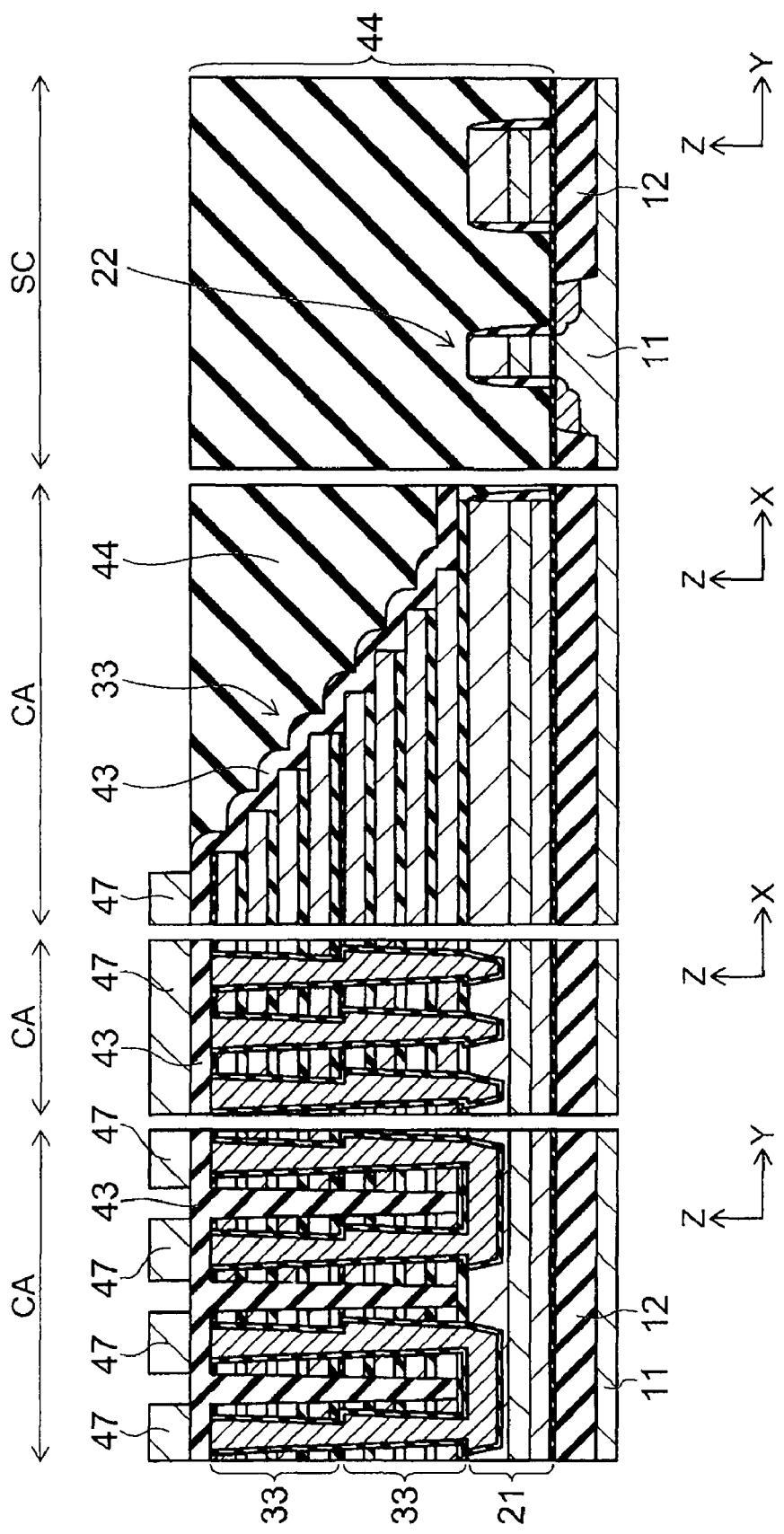
Figures 16A, 16B, 16C, 16D:
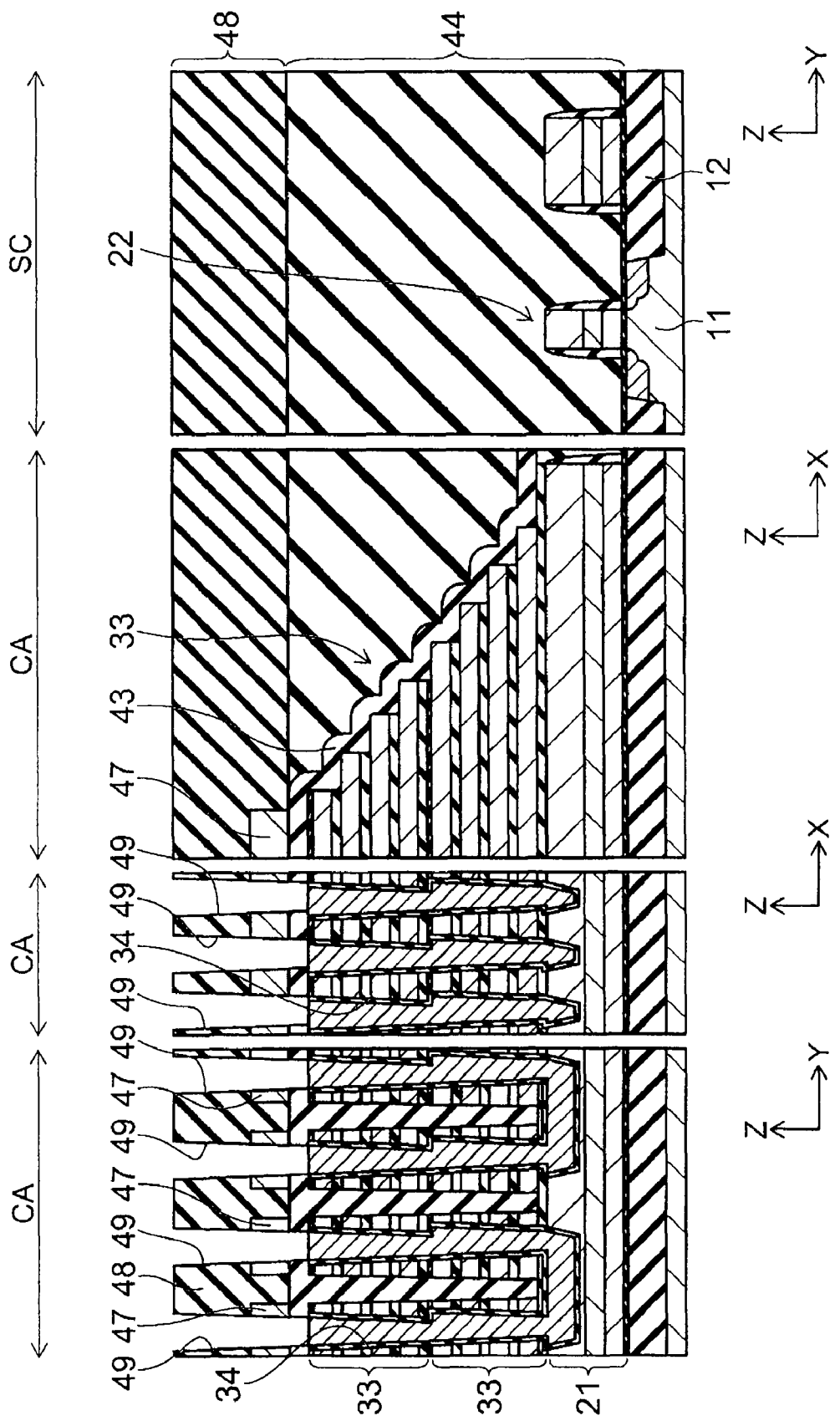
Figures 18A, 18B, 18C, 18D:
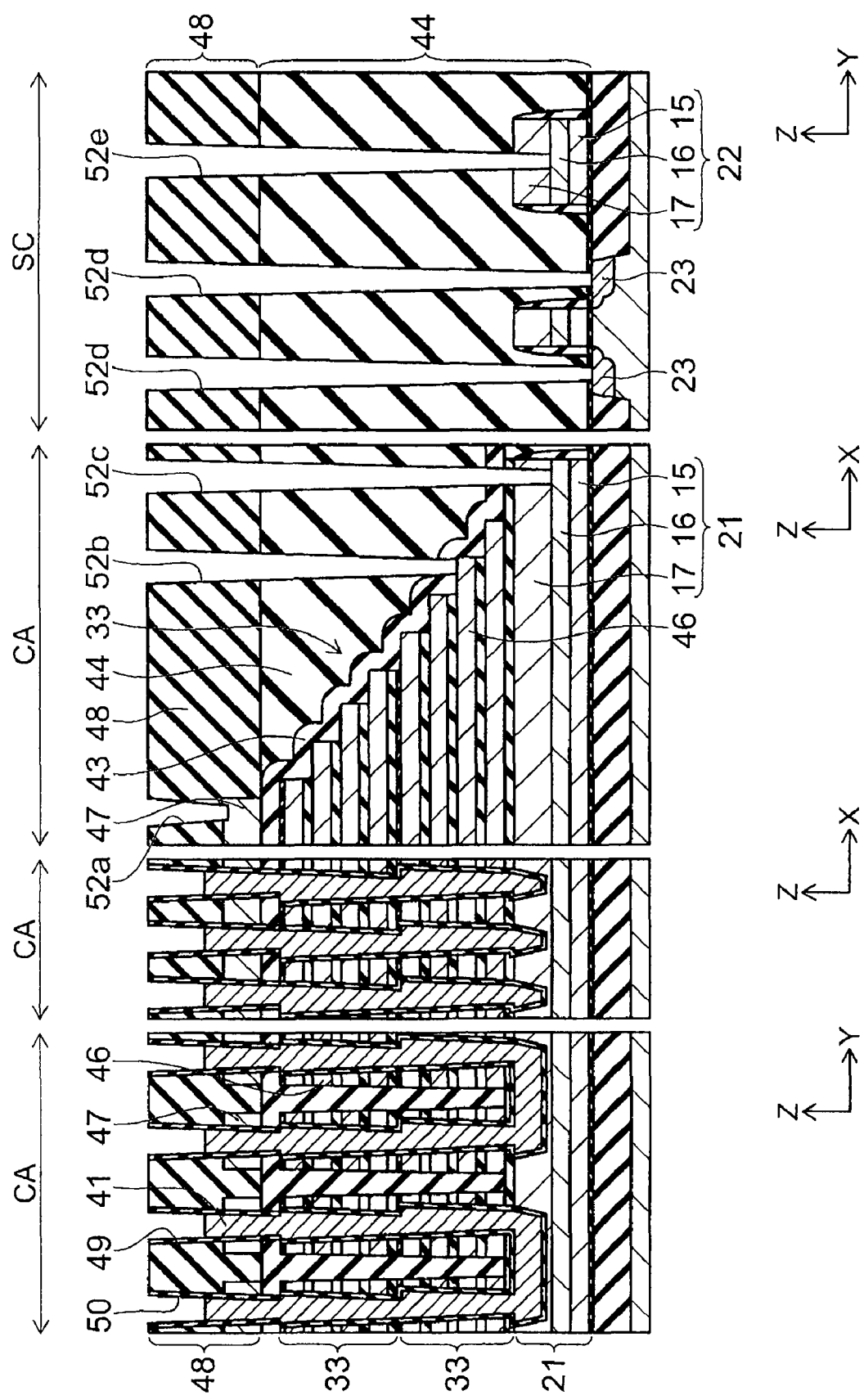
Figures 19A, 19B, 19C, 19D:
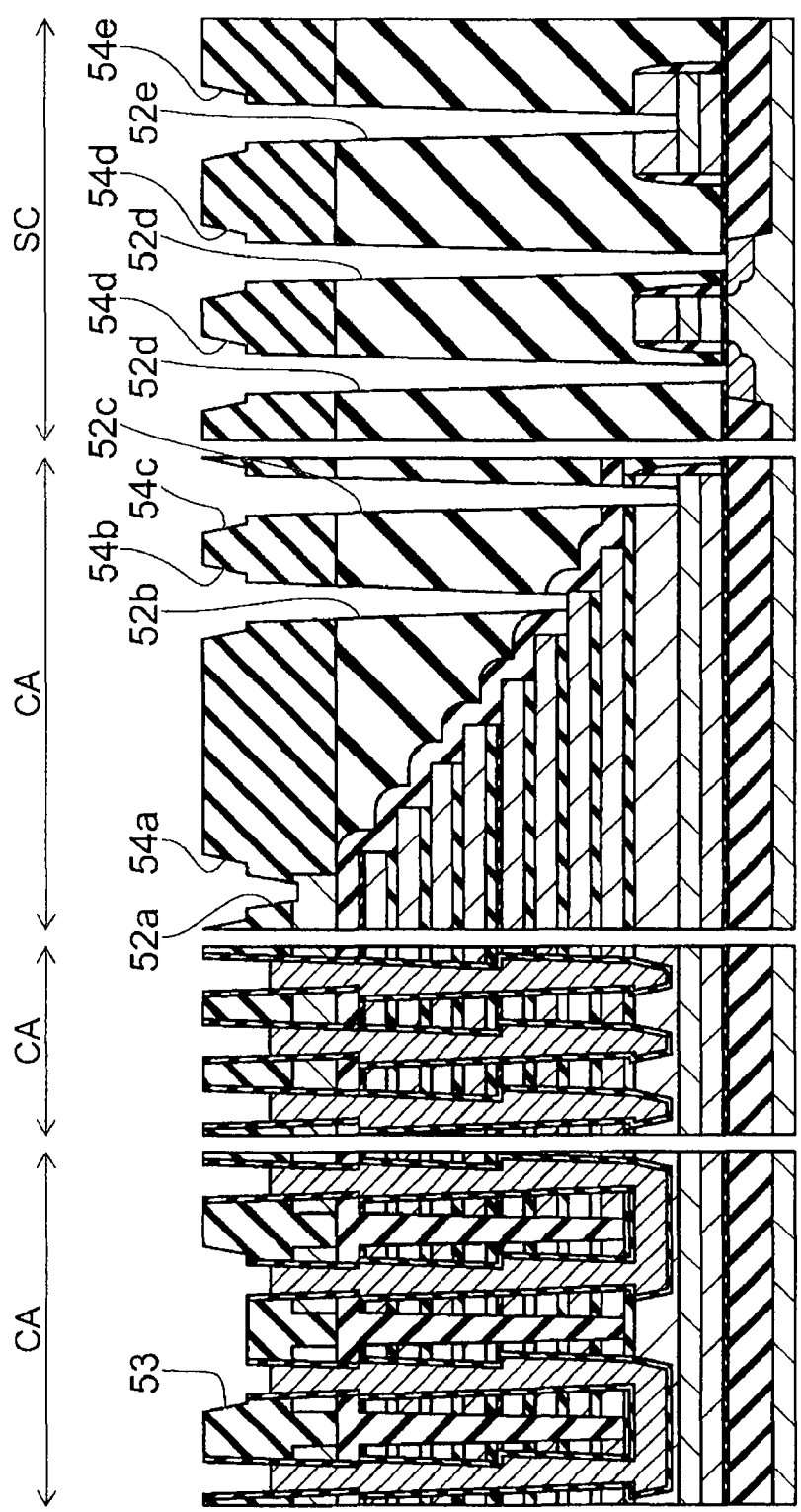
Figures 21A, 21B, 21C, 21D:
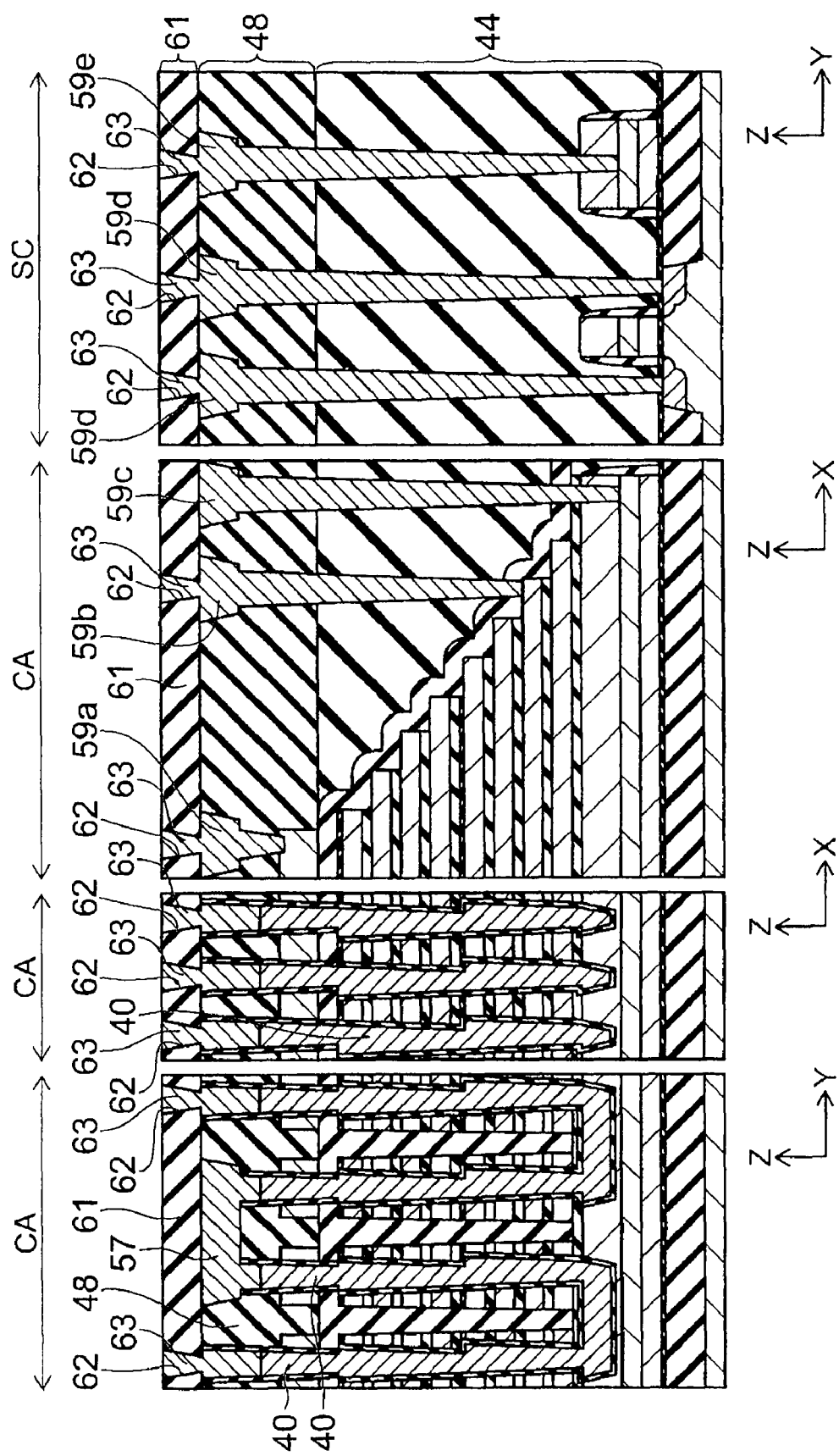
Figures 22A, 22B, 22C, 22D:
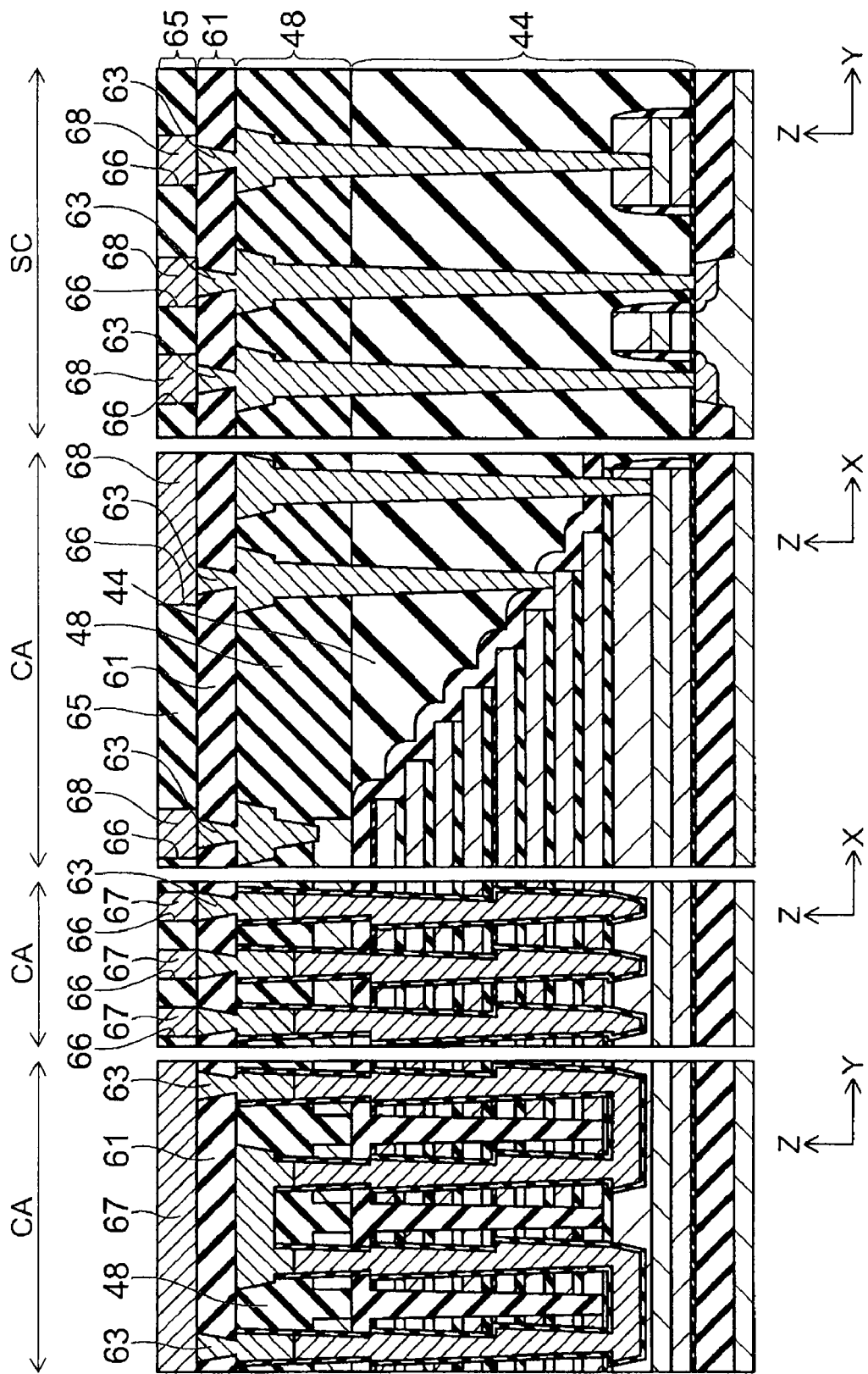

FIG. 3A is a cross-sectional view illustrating a back gate electrode in the cell array section, and FIG. 3B is a cross-sectional view illustrating a gate electrode of a transistor in the peripheral circuit section.

For convenience of illustration, in FIG. 2, only conductive portions are mainly shown and substantial portions of insulating elements are omitted. Moreover, in FIGS. 3A and 3B, only silicon substrate, STI, back gate electrode, gate electrode, and contact plug are shown.

The semiconductor memory device according to this embodiment is characterized in that a memory array section having three-dimensionally arranged memory transistors and a peripheral circuit section for driving the memory array section are provided, a back gate electrode provided in a lowermost layer of the memory array section and a gate electrode of a transistor provided in the peripheral circuit section are formed by patterning the same conductive film, and the conductive film is formed as a three-layer structure comprising a pair of semiconductor layers sandwiching a conductive layer. The configuration of the semiconductor memory device is described in detail below.

As shown in FIGS. 1A to 1D and FIG. 2, a silicon substrate 11 is provided in a semiconductor memory device 1 according to this embodiment. In the silicon substrate 11, a cell array section CA having memory cells formed therein and a peripheral circuit section SC having peripheral circuits formed therein are provided. The peripheral circuit section SC drives the cell array section CA and is disposed around the cell array section CA.

In the following, for convenience of description, an XYZ orthogonal coordinate system is herein introduced. In this coordinate system, the two directions parallel to the upper surface of the silicon substrate 11 and orthogonal to each other are referred to as an X direction and a Y direction, and the direction orthogonal to both the X direction and the Y direction, or the stacking direction of each layer, is referred to as a Z direction.

In the cell array section CA, for example, a STI 12 made of, for example, silicon oxide is formed in an upper portion of the silicon substrate 11, and a gate insulating film 13 is formed thereupon. Further, a back gate electrode 21 is provided on the gate insulating film 13. The back gate electrode 21 is the electrode located in the lower portion of the cell array section CA. In the back gate electrode 21, a n-type silicon layer 15 as a lower semiconductor layer, a metal silicide layer 16 as a conductive layer, and a p-type silicon layer 17 as an upper semiconductor layer are stacked in order from the lower layer side. Further, sidewalls 24 are provided on the side surface of the back gate electrode 21. Moreover, multiple recesses 28 are formed in the p-type silicon layer 17 of the back gate electrode 21 so as to extend from the upper surface side. The shape of the recess 28 is, for example, a rectangular parallelepiped.

The n-type silicon layer 15 is formed of polysilicon having $n^+$ type conductivity and has a film thickness of, e.g., 60 nm, and the n-type silicon layer 15 is doped with, for example, a phosphorous (P) concentration of about $1 \times 10^{20}$ cm$^{-3}$ as an impurity. Further, the metal silicide layer 16 is formed of tungsten silicide. Alternatively, the metal silicide layer 16 may be formed of metal silicide other than tungsten silicide, for example, formed of titanium silicide or nickel silicide. Moreover, the p-type silicon layer 17 is formed of polysilicon having $p^+$-type conductivity and has a film thickness of, e.g., 200 nm, and the p-type silicon layer 17 is doped with a boron (B) concentration of about $1 \times 10^{20}$ cm$^{-3}$ as an impurity.

Stacked bodies 33 are stacked, for example, in two levels on the back gate electrode 21. In each of the stacked bodies 33, a plurality of insulating films 31 and a plurality of electrode films 32 are alternately stacked, for example, four layers of the electrode films 32 are stacked. The insulating film 31 is formed of, e.g., silicon oxide (SiO$_2$) and serves as an interlayer insulating film insulating the electrode films 32 from each other. On the other hand, a portion of the electrode film 32 that is located at the end of the stacked body 33 is formed of, e.g., polysilicon, and a portion of the electrode film 32 that is located in the portion excluding the end of the stacked body 33 is formed of, e.g., cobalt silicide. In the portion of the stacked body 33 excluding the end, the electrode film 32 is divided along the Y direction to form a plurality of gate electrodes 46 extending in the X direction.

In the stacked body 33, a plurality of through-holes 34 extending in the stacking direction of each layer (Z direction) are formed to pierce the stacked body 33. Each of the through-holes 34 pierces the control gate electrode 46 in each level, and the lower end reaches the back gate electrode 21. Further, the through-holes 34 are arranged in a matrix configuration along the X and Y directions. Since the control gate electrode 46 extends in the X direction, the through-holes 34 arranged in the X direction pierce the same control gate electrode 46. In contrast, a pair of through-holes 34 adjacent to each other in the Y direction is in communication with the same recess 28 at both ends thereof. Thus, the pair of through-holes 34 adjacent to each other in the Y direction and the recess 28 allowing communication between the pair of through-holes form a continuous U-shaped hole 37. In this manner, a plurality of U-shaped holes 37 are formed in the stacked bodies 33.

A memory film 38 is continuously and seamlessly provided on the inner surface of the U-shaped hole 37. In the memory film 38, a block insulating layer of silicon oxide, a charge storage layer of silicon nitride, and a tunnel insulating layer of silicon oxide are stacked in order from the outside. The block insulating layer is a layer that substantially blocks current from flowing even when a voltage within a range of the driving voltage of the semiconductor memory device 1 is applied. The charge storage layer is a layer that is capable of holding charges and has, for example, electron trapping sites. The tunnel insulating layer is a layer that normally exhibits an insulating character, however, allows a tunnel current to pass therethrough when a predetermined voltage within a range of the driving voltage of the semiconductor memory device 1 is applied.

Further, the inside of the U-shaped hole 37 is filled with a semiconductor material doped with impurities, for example, polysilicon. Thus, a U-shaped pillar 41 is formed inside the U-shaped hole 37. A portion of the U-shaped pillar 41 that is located within the through-hole 34 forms a silicon pillar 40, and a portion thereof that is located in the recess 28 forms a connection member 39. The silicon pillar 40 has a columnar configuration extending in the Z direction, for example, a cylindrical configuration. Further, the connection member 39 has a rectangular parallelepiped configuration extending in the Y direction. Two silicon pillars 40 and one connection member 39 constituting the U-shaped pillar 41 are formed integrally, and thus, the U-shaped pillar 41 is formed continuously and seamlessly along its longitudinal direction. Further, the U-shaped pillar 41 is insulated from the back gate electrode 21 and the control gate electrode 46 by the memory film 38.

The end of the stacked body 33 is patterned into a stairstep configuration. Specifically, as viewed from above, the electrode film 32 of each level is disposed in the inside of the electrode film 32 of the lower level than it, and the end of the electrode film 32 of each level is not covered by the electrode film 32 of the higher level than it. Further, the upper and side surfaces of the stacked body 33 of the highest level and the side surfaces of the stacked body 33 other than the highest level are covered by an etch stop film 43 of, e.g., silicon nitride.

In contrast, in the peripheral circuit section SC, the STI 12 is formed in a region between the regions where elements, such as a transistor, in the upper portion of the silicon substrate 11 is formed. Further, field effect transistors 25 are formed in part of the regions zoned by the STI 12. In the field effect transistor 25, a gate insulating film 13 is formed on the upper surface of the silicon substrate 11, and a gate electrode 22 is formed thereupon. Sidewalls 24 are formed on the side surfaces of the gate electrode 22. Further, a pair of source/drain regions 23 spaced apart from each other is formed in the upper portions of the silicon substrate 11 not covered by the gate electrode 22.

The gate electrode 22 has the same layered configuration as the back gate electrode 21. Specifically, also in the gate electrode 22, the n-type silicon layer 15 of n-type polysilicon, the metal silicide layer 16 of, e.g., tungsten silicide, and the p-type silicon layer 17 of p-type polysilicon are stacked in order from the lower layer side. Since the back gate electrode 21 and the gate electrode 22 are formed by patterning the same conductive film, the n-type silicon layer 15 of the back gate electrode 21 and the n-type silicon layer 15 of the gate electrode 22 are substantially the same in thickness and composition, the metal silicide layer 16 of the back gate electrode 21 and the metal silicide layer 16 of the gate electrode 22 are substantially the same in thickness and composition, and the p-type silicon layer 17 of the back gate electrode 21 and the p-type silicon layer 17 of the gate electrode 22 are substantially the same in thickness and composition.

In both the cell array section CA and the peripheral circuit section SC, an interlayer insulating film 44 of, e.g., silicon oxide is formed on the silicon substrate 11. The stacked bodies 33, the etch stop film 43, and the gate electrode 22 are buried in the interlayer insulating film 44.

A plurality of selection gate electrodes 47 in the form of a line extending in the X direction are provided above an upper surface of the uppermost stacked body 33 i.e., on the etch stop film 43. The selection gate electrodes 47 are disposed immediately above the control gate electrodes 46.

On the interlayer insulating film 44, an interlayer insulating film 48 is formed over the selection gate electrodes 47. A through-hole 49 is formed in a portion corresponding to an area immediately above the through-hole 34 in the interlayer insulating film 48, and the through-hole 49 is communicated with the through-hole 34. A selection gate insulating film 50 is formed on the side surface of the through-hole 49. Further, the U-shaped pillar 41 is extended by filling a polysilicon into a lower portion of the inside of the through-hole 49, and a plug 56 is filled into an upper portion thereof.

Contact plugs 58a connected to the selection gate electrodes 47 from above are filled into a lower portion of the interlayer insulating film 48. Further, contact plugs 58b connected to the electrode films 32 from above, contact plugs 58c connected to the back gate electrode 21 from above, contact plugs 58d connected to the source/drain regions 23 from above, and contact plugs 58e connected to the gate electrodes 22 from above are formed within the lower portion of the interlayer insulating film 48 and within the interlayer insulating film 44. Although only one contact plug 58b is shown in FIGS. 1A to 1D, at least one contact plug 58b per one electrode film 32 is provided in practice.

Interconnects 59a to 59e connected to the contact plugs 58a to 58e are respectively formed within an upper portion of the interlayer insulating film 48 directly above the contact plugs 58a to 58e. Further, source lines 57 are formed within the upper potion of the interlayer insulating film 48 and are connected to one of the pair of silicon pillars 40 constituting each U-shaped pillar 41. The plugs 56, the contact plugs 58a to 58e, the interconnects 59a to 59e, and the source lines 57 are formed by stacking a titanium film, a titanium nitride film, and a tungsten film in this order.

As shown in FIG. 3A, the contact plug 58c pierces the p-type silicon layer 17 of the back gate electrode 21 and is contact with the metal silicide layer 16. The contact plug 58c is a back gate electrode contact plug for applying a control potential to the back gate electrode 21. Likewise, as shown in FIG. 3B, the contact plug 58e pierces the p-type silicon layer 17 of the gate electrode 22 and is in contact with the metal silicide layer 16. The contact plug 58e is a gate electrode contact plug for applying a control potential to the gate electrode 22.

As shown in FIGS. 1A to 1D, an interlayer insulating film 61 is provided on the interlayer insulating film 48. A plurality of contact plugs 63 are formed within the interlayer insulating film 61. Each of the contact plugs 63 is connected to the plugs 56 and interconnects 59a, 59b, 59d, and 59e, respectively. An interlayer insulating film 65 is provided on the interlayer insulating film 61. Bit lines 67 and interconnects 68 connected to the contact plugs 63 are formed within the interlayer insulating film 65. The bit line 67 is connected through the contact plug 63 to one of the pair of silicon pillars 40 that is not connected to the source line 57. Thus, the U-shaped pillar 41 is connected between the source line 57 and the bit line 67.

An interlayer insulating film 71 is provided on the interlayer insulating film 65, and contact plugs 73 connected to the bit lines 67 and the interconnects 68 are formed within the interlayer insulating film 71. Interconnects 75 made of, e.g., aluminum are formed on the interlayer insulating film 71 and connected to the contact plugs 73. A protective film 79 is provided over the interconnects 75 on the interlayer insulating film 71. The protective film 79 is a two-layered film consisting of a lower layer formed of a silicon oxide film 77 and an upper layer formed of a silicon nitride film 78.

As shown in FIGS. 1 to 3B, in the semiconductor memory device 1, the silicon pillars 40 serve as a channel and the control gate electrodes 46 serve as a gate electrode, thereby forming vertical memory transistors at intersections of the silicon pillars 40 and the control gate electrodes 46. Each of the memory transistors serves as a memory cell by storing electrons in an electrical charge storage layer of the memory film 38 disposed between the silicon pillar 40 and the control gate electrode 46. Since a plurality of silicon pillars 40 are arranged in the stacked bodies 33 in a matrix form along the X and Y directions, a plurality of memory transistors are three-dimensionally arranged along the X, Y, and Z directions.

The back gate electrode 21 and the connection member also form a field effect transistor. Specifically, the connection member 39 serving as a channel, the back gate electrode 21 serving as a control gate, and the memory film 38 disposed therebetween and serving as a gate insulating film form a field effect transistor. Thus, selection of a potential of the back gate electrode 21 allows the connection member 39 to switch between conductive and non-conductive states, thereby controlling the conductive state of all of the U-shaped pillars 41.

A method for manufacturing a semiconductor memory device according to this embodiment will now be described.

FIGS. 4A to 23D are process cross-sectional views illustrating the method for manufacturing a semiconductor memory device according to this embodiment. FIG. A of each of these drawings illustrates a cross section along the bit line direction in the cell array section, FIG. B of each of these drawings illustrates a cross section along the source line direction in the cell array section, FIG. C of each of these drawings illustrates the end of the cell array section, and FIG. D of each of these drawings illustrates the peripheral circuit section.

First, as shown in FIGS. 4A to 4D, a silicon substrate 11 is prepared. A cell array section CA and a peripheral circuit section SC are provided on the silicon substrate 11. Then, a predetermined insulating film is formed on the upper surface of the silicon substrate 11. Specifically, at boundaries of regions where elements, such as a transistor, are formed in all of the cell array sections CA and the peripheral circuit section SC, an STI (shallow trench isolation) 12 is formed in an upper portion of the silicon substrate 11. Further, a gate insulating film 13 is formed all over the upper surface of the silicon substrate 11.

Next, an $n^+$-type silicon layer 15 is formed by depositing an $n^+$-type polysilicon doped with phosphorous by the concentration of $1 \times 10^{20}$ cm$^{-3}$ in thickness of 60 nm by CVD (chemical vapor deposition) at a temperature of 525° C., for example, using $SiH_4$ gas and $PH_3$ gas as reactant gas. Then, a metal silicide layer 16 is formed by depositing tungsten silicide (WSi) in thickness of 50 nm by CVD at a temperature of 390° C., for example, using $WF_6$ gas and $SiH_4$ gas as reactant gas. Then, a $p^+$-type silicon layer 17 is formed by depositing a $p^+$-type polysilicon doped with boron by the concentration of $1 \times 10^{20}$ cm$^{-3}$ In thickness of 200 nm by CVD at a temperature of 525° C., for example, using $SiH_4$ gas and $BH_6$ gas as reactant gas.

Thus, the $n^+$-type silicon layer 15 as a lower semiconductor layer, the metal silicide layer 16 as a conductive layer, and the $p^+$-type silicon layer 17 as an upper semiconductor layer are stacked on the STI 12 or the gate insulating film 13 in this order to form a conductive film 18.

Alternatively, after depositing a metal layer on the $n^+$-type silicon layer 15 and depositing the $p^+$-type silicon layer 17, the metal layer may be transformed into the metal silicide layer 16 by performing heat treatment to achieve the reaction between metal of the metal layer and silicon of the n-type silicon layer 15 and the p-type silicon layer 17 respectively located above and below the metal layer. In this case, when the metal layer is formed of tungsten, the metal silicide layer 16 is formed of tungsten silicide. An unreacted metal layer may be left in the center of the metal silicide layer 16. Further, the heat treatment used to form metal silicide layer may be carried out later in the processing sequence. Moreover, instead of tungsten, titanium (Ti) or nickel (Ni) may be deposited.

As shown in FIGS. 5A to 5D, a resist pattern (not shown) is formed by photolithography, and RIE is carried out using the resist pattern as a mask to form a plurality of recesses 28 in the upper surface of the p-type silicon layer 17 of the conductive film 18 in the cell array section CA. The recesses 28 take the form of, e.g., a rectangular parallelepiped extending in the Y direction and are arranged in a matrix form along the X and Y directions. Further, the recesses 28 are formed inside the p-type silicon layer 17 so as not to reach the metal silicide layer 16. The resist pattern serving as a mask during the RIE is appropriately removed after RIE. The same procedure is carried out in the subsequent processes.

Subsequently, e.g., a silicon nitride is deposited on the conductive film 18. The silicon nitride is deposited also inside the recesses 28 besides on the upper surface of the conductive film 18. Then, the silicon nitride is removed from the upper surface of the conductive film 18 by CMP (chemical mechanical polishing) or RIE (reactive ion etching) and left only in the recesses 28. Thus, a sacrificial member 29 of, e.g., silicon nitride is filled into the recesses 28.

Then, a resist pattern (not shown) is formed by lithography, and RIE is carried out using the resist pattern as a mask to pattern the conductive film 18. Thus, a back gate electrode 21 of the conductive film 18 in the cell array section CA as well as a gate electrode 22 of the conductive film 18 in the peripheral circuit section SC are formed. At this time, all the aforementioned recesses 28 are formed in the back gate electrode 21 and not in the gate electrode 22.

Next, impurities are ion-implanted into the upper portion of the silicon substrate 11 using the gate electrodes 22 as a mask to form source/drain regions 23 in regions of the silicon substrate 11 not covered by the gate electrode 22. Then, an insulating film of, e.g., silicon oxide is deposited on the entire surface. Next, the insulating film is etched back and removed from the upper surfaces of the back gate electrode 21, gate electrode 22, and gate insulating film 13 while leaving the insulating film on the side surfaces of the back gate electrode 21 and gate electrode 22, resulting in formation of sidewalls 24 on the side surfaces of the back gate electrode 21 and gate electrode 22. Thus, a field effect transistor 25 is formed in the peripheral circuit section SC. Thereafter, the outer periphery of the back gate electrode 21 and gate electrode 22 is filled with an insulating film 26, and the upper surface of which is planarized.

Alternatively, in the processes shown in FIGS. 5A to 5D, the order of the processes may be reversed. Specifically, first, the conductive film 18 is patterned to form the back gate electrode 21 and gate electrode 22, and then, the recesses 28 may be formed in the p-type silicon layer 17 of the back gate electrode 21.

As shown in FIGS. 6A to 6D, multiple insulating films 31 and multiple electrode films 32 are alternately stacked both in the cell array section CA and peripheral circuit section SC to form stacked bodies. The insulating film 31 is formed of, e.g., silicon oxide film, and the electrode film 32 is formed of, e.g., polysilicon film.

Then, a resist pattern (not shown) is formed on the stacked bodies 33 by lithography, and RIE is carried out using the resist pattern as a mask to form through-holes 34 extending in the stacking direction (Z direction) in the stacked bodies 33. At this time, respective through-holes 34 are formed to reach both ends, in the Y direction, of the sacrificial member 29. Specifically, two through-holes 34 are formed to reach each sacrificial member 29. Then, e.g., silicon nitride is deposited on the entire surface and is removed from the upper surface of the stacked body 33 by, e.g., CMP. Thus, sacrificial members 35 of silicon nitride are filled into the through-holes 34. The sacrificial members 35 are in contact with the sacrificial members 29 in the recesses 28.

Then, the aforementioned successive processes, i.e., the process of alternately depositing the insulating films 31 and electrode films 32 to form the stacked bodies 33, the process of forming the through-holes 34, and the process of filling the sacrificial members 35 are repeated in multiple times as necessary. At this time, the through-holes 34 formed in respective stacked bodies 33 are caused to be in communication with each other. For example, in an example shown in shown in FIGS. 6A to 6D, four layers of the insulating films 31 and four layers of the electrode films 32 are stacked to form the stacked body 33, and the stacked bodies 33 are stacked in two levels. However, the number of laminations in each stacked body 33 is not limited to four, and the number of laminations of the stacked bodies 33 is also not limited to two. The maximum number of laminations in each of the stacked bodies 33 is dictated by the limitations of the method for forming the through-holes 34 and filling the sacrificial members 35 into the through-holes. Accordingly, the number of laminations of the stacked bodies 33 may be determined depending on the required total number of laminations of the electrode films 32.

As shown in FIGS. 7A to 7D, for example, a wet etch process with hot phosphorous is performed to remove the sacrificial members 35 (refer to FIGS. 6A to 6D) from the inside of the through-holes 34, and the sacrificial members 29 (refer to FIGS. 6A to 6D) are continuously removed from the inside of the recesses 28 by etching through the through-holes 34. Thus, U-holes 37, each consisting of each recess 28 and a pair of through-holes 34 in communication with both ends of the recess 28, are formed. As viewed in the X direction, the U-hole 37 is U-shaped. Then, the inner surfaces of the U-holes 37 are cleaned using dilute-buffered hydrofluoric acid.

As shown in FIGS. 8A to 8D, for example, a silicon oxide layer, a silicon nitride layer, and a silicon oxide layer are deposited in this order to form a memory film 38 on the inner surfaces of the U-holes 37 and the upper surface of the uppermost stacked body 33. The memory film 38 is formed such that the initially-formed silicon oxide layer constitutes a block insulating layer, the silicon nitride layer constitutes a charge storage layer, and the finally-formed silicon oxide layer constitutes a tunnel insulating layer. At this time, the U-hole 37 is not completely filled with the memory film 38, leaving a U-shaped void in the U-hole 37.

As shown in FIGS. 9A to 9D, a semiconductor material is deposited on the entire surface. For example, silicon is deposited by CVD. Thus, connection members 39 of rectangular parallelepiped shape are filled into the recesses 28, and silicon pillars 40 of cylindrical shape are filled into the through-holes 34. At this time, one connection member 39 and a pair of the silicon pillars 40 filled into each U-hole 37 form a U-shaped pillar 41 of polysilicon. The U-shaped pillar 41 becomes a channel for a memory transistor formed in a later process.

Since the memory film 38 has been continuously formed on the interior surfaces of the U-holes 37, pretreatment is not required to form the U-shaped pillar 41. Further, the amount of deposited silicon is preferably selected so that the U-hole 37 is not completely filled with silicon, leaving a void in the center of the hole. Thus, the U-shaped pillar 41 like a pipe is formed and the wall thickness of the pipe, i.e., the thickness of the polysilicon film is constant regardless of variations in the diameter of the recess 28 and through-hole 34. Consequently, the characteristics of the memory transistor become stable. In this case, after formation of the U-shaped pillar 41, the inner surface of the U-shaped pillar 41 in a pipe shape is oxidized, followed by deposition of silicon oxide by, e.g., CVD to fill in the remaining space of the through-hole 34 with the silicon oxide (not shown).

As shown in FIGS. 10A to 10D, for example, RIE is carried out to remove the silicon oxide (not shown), polysilicon film, and memory film 38 from the upper surface of the uppermost stacked body 33 while also recessing the upper end portion of the material filled into the U-holes 37. Afterwards, a polysilicon film is deposited to fill in the recessed portion of the material filled into the U-holes 37 with polysilicon for planarization. In this manner, the memory transistor is formed at every intersection of the U-shaped pillars 41 and the electrode films 32.

As shown in FIGS. 11A to 11D, a resist pattern (not shown) is formed on the uppermost stacked body 33 to cover the cell array section CA. Then, RIE is carried out using the resist pattern as a mask to remove the stacked bodies 33 from the peripheral circuit section SC, leaving the stacked bodies only in the cell array section CA. Then, slimming of the resist pattern and RIE using the resist pattern as a mask are repeatedly carried out to process the ends of the stacked bodies into a stairstep configuration. Thus, as viewed from above (in the Z direction), the end of the electrode film 32 at each level is not covered by the electrode film 32 at the higher level, allowing a contact component to extend down into the electrode film 32 at each level in a later process.

As shown in FIGS. 12A to 12D, an etch stop film 43 of, e.g., silicon nitride is formed over the stacked bodies 33 processes into a stairstep configuration in the cell array section CA. The etch stop film 43 serves as a stopper of etching in forming contact holes in a later process. Then, an interlayer insulating film 44 is formed on both the cell array section CA and peripheral circuit section SC. Next, CMP is carried out using the etch stop film 43 as a stopper to planarize the upper surface of the interlayer insulating film 44. Thus, a space around the stacked bodies 33 is filled with the interlayer insulating film 44. Further, the gate electrode 22 of the peripheral circuit section SC is also covered by the interlayer insulating film 44.

As shown in FIGS. 13A to 13D, a resist pattern (not shown) is formed by photolithography, and RIE is carried out using the resist pattern as a mask to form, in the etch stop film 43 and stacked bodies 33, line-shaped trenches 45 extending in the X direction. The trench 45 is formed in an area immediately above the connection member 39, i.e., a region between a pair of the silicon pillars 40 connected to one connection member 39, or is formed so as to pass through a region between a pair of the silicon pillars 40 adjacent to each other in the Y direction and connected to different connection members 39. Further, the trench 45 extends to the upper surface of the insulating film 31 at the lowest level in the lowermost stacked body 33, but not to the connection member 39. Thus, the electrode films 32 are divided along the X direction into a plurality of control gates 46 extending in the Y direction.

As shown in FIGS. 14A to 14D, a metal, e.g., cobalt (Co) is deposited by, e.g. CVD for silicidation of the control gate electrode 46 at least in the cell array section CA. Cobalt is filled also into the trenches 45 to be in contact with the exposed surfaces of the control gate electrodes 46. Then, RTA (rapid thermal anneal) is carried out to cause the silicon contained in the control gate electrodes 46 to react with cobalt filled into the trenches 45. Thus, a portion of the control gate electrodes 46 that does not include the ends of the stacked bodies 33 can be converted into cobalt silicide. In this manner, the gate electrode 46 of cobalt silicide can be formed in a self-aligned fashion. Afterwards, mixture of sulfuric acid and hydrogen peroxide is used to remove unreacted cobalt remaining in the trenches 45 and on the stacked bodies 33.

As shown in FIGS. 15A to 15D, silicon nitride is deposited in the trenches 45 to fill at least the upper portions thereof. Then, a tungsten silicide film is formed on the etch stop film 43 formed on the uppermost stacked body 33. Thereafter, the tungsten silicide film is divided along the Y direction by lithography and RIE into line-shaped selection gate electrodes 47 extending in the X direction.

As shown in FIGS. 16A to 16D, an interlayer insulating film 48 is deposited on the entire surface to cover the selection gate electrodes 47, and the upper surface of the interlayer insulating film 48 is planarized by CMP. Then, through-holes 49 are formed in the interlayer insulating film 48 by lithography and RIE. The through-holes 49 are formed immediately above the through-holes 34 and in communication therewith.

As shown in FIGS. 17A to 17D, e.g., a silicon nitride film is formed on the upper surface of the interlayer insulating film 48 and on the inner surfaces of the through-holes 49. Then, RIE is carried out to remove the silicon nitride film from the upper surface of the interlayer insulating film 48 and the bottom surfaces of the through-holes 49 while leaving the silicon nitride film on the side surfaces of the through-holes 49. Thus, a selection gate insulating film 50 of silicon nitride is formed on the side surfaces of the through-holes 49. Then, an inside of the through-holes 49 is cleaned using dilute-buffered hydrofluoric acid.

Subsequently, a semiconductor material, e.g., polysilicon is deposited entirely. Then, the polysilicon deposited on the upper surface of the interlayer insulating film 48 is removed, and the polysilicon filled into an upper portion of the through-holes 49 is recessed. Thus, the polysilicon is filled into a portion of the through-holes 49 other than the upper portion of the through-holes 49. The polysilicon is integral with the U-shaped pillar 39, which, accordingly, extends upwards. Consequently, selection transistors having an extension portion as a channel are formed at intersections of the selection gate electrodes 47 and the extension portions of the U-shaped pillars 39.

As shown in FIGS. 18A to 18D, by lithography and RIE, contact holes 52a to 52e are formed inside the interlayer insulating film 48 and interlayer insulating film 44 formed respectively in the end of the cell array section CA and the peripheral circuit section SC. Specifically, in the cell array section CA, the contact hole 52a reaching the selection gate electrode 47, the contact hole 52b reaching the control gate electrode 46, and the contact hole 52c reaching the back gate electrode 21 are formed. Further, in the peripheral circuit section SC, the contact holes 52d reaching the source/drain regions 23 and the contact hole 52e reaching the gate electrode 22 are formed. At this time, the contact hole 52c reaching the back gate electrode 21 and the contact hole 52e reaching the gate electrode 22 are formed to pierce the p-type silicon layer 17 and extend to the metal silicide layer 16. Specifically, the metal silicide layer 16 is exposed at the bottom surfaces of the contact holes 52c and 52e. During the RIE procedure used to form the contact holes 52a to 52e, the etch stop film 43 is used as a stopper. Thus, etching endpoint can be controlled with high accuracy.

As shown in FIGS. 19A to 19D, by lithography and RIE, interconnect trenches 53 extending in the X direction are formed in regions where the source lines 57 (refer to FIGS. 1A to 1D) in an upper portion of the interlayer insulating film 48 will be formed, whereas interconnect trenches 54a to 54e extending in the X direction are formed immediately above the contact holes 52a to 52e, respectively.

As shown in FIGS. 20A to 20D, titanium film, titanium nitride film, and tungsten film are deposited in this order on the entire surface to form a three-layer conductive film. Then, CMP is carried out to remove a portion of the conductive film that is deposited on the upper surface of the interlayer insulating film 48. Thus, an upper portion of the through-holes 49, the interconnect trenches 53, the contact holes 52a to 52e, the interconnect trenches 54a to 54e are filled with the conductive film. Consequently, plugs 56 are filled into the upper portion of the through-holes 49, the source lines 57 are formed within the interconnect trenches 53, the contact plugs 58a to 58e are filled into the contact holes 52a to 52e, and the interconnects 59a to 59e are placed in the interconnect trenches 54a to 54e. Thus, the contact plugs and interconnects are simultaneously formed by dual damascene patterning.

As shown in FIGS. 21A to 21D, an interlayer insulating film 61 is formed on the interlayer insulating film 48, and contact holes 62 are formed by lithography and RIE. Then, e.g., titanium film, titanium nitride film, and tungsten film are deposited in this order to form a conductive film, and the conductive film formed on the upper surface of the interlayer insulating film 61 is removed by CMP, thereby filling contact plugs 63 into the contact holes 62. One group of the contact plugs 63 are connected to the silicon pillars 40 which are not connected to the source lines 57. Further, another group of the contact plugs 63 are connected to the interconnects 59a, 59b, 59d, and 59e.

As shown in FIGS. 22A to 22D, an interlayer insulating film 65 is formed on the interlayer insulating film 61, and interconnect trenches 66 are formed in the interlayer insulating film 65 by lithography and RIE. Then, a tantalum film, a tantalum nitride film, and a copper film are deposited in this order to form a conductive film, and the conductive film is removed from the upper surface of the interlayer insulating film 65 by CMP. Thus, bit lines 67 and interconnects 68 are formed in the interconnect trenches 66. The bit lines 67 and interconnects 68 are connected to the contact plugs 63. Consequently, one of the pair of silicon pillars 40 constituting each U-shaped pillar 41 is connected to the source line 57, and the other is connected to the bit line 67.

As shown in FIGS. 23A to 23D, an interlayer insulating film 71 is formed on the interlayer insulating film 65, and contact holes 72 are formed in the interlayer insulating film 71 by lithography and RIE. Then, e.g., a titanium film, a titanium nitride film, and an aluminum copper film are deposited in this order to form a conductive film, and the conductive film formed on the upper surface of the interlayer insulating film 71 is removed by CMP, thereby filling contact plugs into the contact holes 72. The contact plugs 73 are connected to the bit lines 67 and one group of the interconnects 68. Then, an aluminum film is formed on the interlayer insulating film 71 and patterned by lithography and RIE to form interconnects 75 and bonding pads (not shown).

As shown in FIGS. 1A to 1D, a silicon oxide film 77 is deposited on the entire surface, followed by deposition of a silicon nitride film 78 on the entire surface. Thus, a protective film 79 of laminations of the silicon oxide film 77 and the silicon nitride film 78 is formed. Then, a portion of the protective film 79 immediately above the bonding pads (not shown) is removed to expose the bonding pads. In this manner, the fabrication of the semiconductor memory device 1 is completed.

Effects of this embodiment will now be described.

In this embodiment, both the back gate electrode 21 in the cell array section CA and the gate electrode 22 of the field effect transistor 25 in the peripheral circuit section SC are formed with a three-layer film of the n-type silicon layer 15, metal silicide layer 16, and p-type silicon layer 17 stacked in this order. Further, the contact plug 58c is caused to be in contact with the metal silicide layer 16 of the back gate electrode 21, and the contact plug 58e is caused to be in contact with the metal silicide layer 16 of the gate electrode 22. Thus, interconnect resistance of the back gate electrode 21 and gate electrode 22 is reduced, while contact resistance between the contact plug 58c and back gate electrode 21, as well as between the contact plug 58e and gate electrode 22 is reduced.

Further, in this embodiment, the back gate electrode 21 and gate electrode 22 can be simultaneously formed by depositing the conductive film 18 of identical configuration. Thus, the fabrication of the semiconductor memory device 1 can be simplified, and the manufacturing cost thereof can be reduced.

Moreover, in this embodiment, in the conductivity film 18 forming the back gate electrode 21 and the gate electrode 22, the conductivity type of the n-type silicon layer 15 as a lower semiconductor layer and the conductivity type of the p-type silicon layer 17 as an upper semiconductor layer are mutually different. Thus, the physical properties of the n-type silicon layer 15 and p-type silicon layer 17 can be designed independently of each other.

Specifically, in the back gate electrode 21, the connection member 39 is formed within the p-type silicon layer 17 as an upper semiconductor layer, and therefore, the properties of the p-type silicon layer 17 behaving as a semiconductor material affect the conduction state of the connection member 39. On the other hand, in the gate electrode 22, the n-type silicon layer 15 as a lower semiconductor layer faces the channel region of the field effect transistor 25 via the gate insulating film 13, and therefore, the properties of the n-type silicon layer 15 behaving as a semiconductor material affect the operation of the field effect transistor 25. In this embodiment, the p-type silicon layer 17 can be designed to control the connection member 39, while the n-type silicon layer 15 can be designed to control the field effect transistor 25.

More specifically, in this embodiment, the silicon layer 17 is of p-type conductivity, and therefore, the work function of the back gate electrode 21 becomes higher. Accordingly, emission of electrons from the back gate electrode 21 to the connection member 39 occurs less frequently, and the amount of electrons accumulated in the memory film 38 disposed between the back gate electrode 21 and connection member 39 can be suppressed.

Specifically, during the erase operation of the semiconductor memory device 1, a potential higher than that of the control gate electrode 46 and back gate electrode 21 is applied to the U-shaped pillar 41 to initiate injection of holes from the U-shaped pillar 41 into the memory film 38, so that electrons accumulated in a charge storage film in the memory film 38 are annihilated in pair. However, at this time, depending on the application conditions, electrons may be injected from the control gate electrode 46 and back gate electrode 21 into the memory film 38 due to the tunneling effect. Particularly, the cylinder-shaped silicon pillar 40 allows more uniform application of electrical field, however, the rectangular parallelepiped connection member 39 causes the electrical field to tend to be concentrated on corners of the member and electrons to tend to be transferred. Further, when electrons are accumulated in the memory film 38 disposed between the back gate electrode 21 and connection member 39, the threshold of the field effect transistor comprised of the back gate electrode 21 and connection member 39 may vary. In this case, methods for removing the electrons accumulated during the erase operation in the memory film 38 is not present, accordingly, methods for initializing the varied threshold is not present.

To overcome this, in this embodiment, the conductivity type of the silicon layer 17 is p-type conductivity so that the work function of a portion of the back gate electrode 21 that is adjacent to the connection member 39 becomes higher, and emission of electrons is suppressed. Consequently, variations in the threshold of the field effect transistor can be prevented.

In contrast, in the peripheral circuit section SC, an n-type silicon film has conventionally been used as the gate electrode 22 of the field effect transistor 25, and individual elements have been designed accordingly. For this reason, it is preferred that an n-type silicon be used as the gate electrode 22 to maximize the utilization of existing design resources.

In this embodiment, the conductive film 18 forming the back gate electrode 21 and gate electrode 22 includes the p-type silicon layer 17 as an upper semiconductor layer determining the properties of the back gate electrode 21 and the n-type silicon layer 15 as a lower semiconductor layer determining the properties of the gate electrode 22. Thus, the stability of the threshold of the above field effect transistor and the utilization of existing design resources are both ensured. Further, the metal silicide layer 16 is interposed between the n-type silicon layer 15 and p-type silicon layer 17, and when a potential is applied to the metal silicide layer 16, a gate resistance is reduced and the formation of a depletion layer at an interface between the n-type silicon layer 15 and p-type silicon layer 17 can be prevented.

It is possible to form the back gate electrode 21 and gate electrode 22 in different processes and make the layer structures of both the electrodes different from each other. However, if so, the number of processes and the manufacturing cost of the semiconductor memory device increase.

Hereinabove, the invention is described with reference to exemplary embodiments. However, the invention is not limited to these embodiments. For example, additions, deletions, or design modifications of components or additions, omissions, or condition modifications of processes appropriately made by one skilled in the art in regard to the embodiments described above are within the scope of the invention to the extent that the purport of the invention is included. For example, although in the aforementioned embodiment, the connection member 39 is shown as being formed within the p-type silicon layer 17 of the back gate electrode 21, the connection member 39 may be placed on the p-type silicon layer 17, as long as the potential of the back gate electrode 21 affects the conductivity of the connection member 39.

The invention claimed is:

1. A semiconductor memory device provided with a cell array section and a peripheral circuit section, the device comprising:
    a semiconductor substrate;
    an insulating film provided on the semiconductor substrate in the cell array section;
    a back gate electrode provided on the insulating film;
    a stacked body provided on the back gate electrode and including a plurality of insulating films and electrode films alternately stacked;
    a plurality of semiconductor pillars extending in a stacking direction of the insulating films and the electrode films of the stacked body and piercing the stacked body;
    connection members provided in or on the back gate electrode, each of the connection members connecting a lower end of one of the semiconductor pillars to a lower end of another one of the semiconductor pillars;
    charge storage layers provided between the electrode films and the semiconductor pillars and between the back gate electrode and the connection members;
    a back-gate electrode contact applying a potential to the back gate electrode;
    a pair of source/drain regions formed apart from each other in an upper layer portion of the semiconductor substrate in the peripheral circuit section;
    a gate insulating film provided immediately above a region between the source/drain regions on the semiconductor substrate;
    a gate electrode provided on the gate insulating film; and
    a gate electrode contact applying a potential to the gate electrode,
    the back gate electrode and the gate electrode respectively including:
        a lower semiconductor layer;
        a conductive layer provided on the lower semiconductor layer; and
        an upper semiconductor layer provided on the conductive layer,
    the connection members being provided in or on the upper semiconductor layer,
    the back-gate electrode contact and the gate electrode contact being in contact with the conductive layer.

2. The device according to claim 1, wherein the lower semiconductor layer and the upper semiconductor layer are formed of silicon.

3. The device according to claim 1, wherein the conductive layer is formed of metal silicide.

4. The device according to claim 3, wherein the metal silicide is tungsten silicide, titanium silicide, or nickel silicide.

5. The device according to claim 1, wherein a conductivity type of the lower semiconductor layer and a conductivity type of the upper semiconductor layer are mutually different.

6. The device according to claim 5, wherein the conductivity type of the lower semiconductor layer is n-type, and the conductivity type of the upper semiconductor layer is p-type.

7. The device according to claim 6, wherein the lower semiconductor layer is made of polysilicon doped with an impurity being donor, the conductive layer is made of metal silicide, and the upper semiconductor layer is made of polysilicon doped with an impurity being acceptor.

8. The device according to claim 1, wherein the connection member is provided in a recess formed in an upper surface of the upper semiconductor layer and is formed integral with the semiconductor pillars.

9. The device according to claim 1, wherein the lower semiconductor layer of the back gate electrode and the lower semiconductor layer of the gate electrode are mutually identical in thickness and composition, the conductive layer of the back gate electrode and the conductive layer of the gate electrode are mutually identical in thickness and composition, and the upper semiconductor layer of the back gate electrode and the upper semiconductor layer of the gate electrode are mutually identical in thickness and composition.

10. The device according to claim 1, further comprising:
    a plurality of selection gate electrodes provided on the stacked body and extending in a first direction;
    a gate insulating film provided between each of the selection gate electrodes and each of the semiconductor pillars;
    a plurality of source lines extending in the first direction and connected to an upper end of the one of the plurality of semiconductor pillars; and
    a plurality of bit lines extending in a second direction intersecting the first direction and connected to an upper end of the another one of the semiconductor pillars,
    the electrode films being divided into a plurality of control gate electrodes extending in the first direction,
    the semiconductor pillars being arranged in a matrix along the first direction and the second directions and piercing the selection gate electrodes.

11. A method for manufacturing a semiconductor memory device provided with a cell array section and a peripheral circuit section, the method comprising:
    forming an insulating film on a semiconductor substrate;
    forming a conductive film including a lower semiconductor layer, a conductive layer, and an upper semiconductor layer being stacked in this order on the insulating film;
    processing the conductive film to form a back gate electrode in the cell array section and a gate electrode in the peripheral circuit section;
    forming source/drain regions in regions of the both sides of a region immediately below the gate electrode of the semiconductor substrate;
    forming a plurality of recesses in an upper surface of the upper semiconductor layer formed in the cell array section;
    filling sacrificial members in the recesses;
    forming a stacked body by alternatively stacking a plurality of insulating films and electrode films on the back gate electrode;
    forming through-holes extending in a stacking direction of the insulating films and the electrode films of the stacked body, two of the through-holes reaching each of the sacrificial members;
    removing the sacrificial members by etching via the through-holes;
    forming charge storage layers on inner surfaces of the through-holes and inner surfaces of the recesses;
    filling semiconductor material inside the through-holes and the recesses to form connection members in the recesses and semiconductor pillars in the through-holes; and forming a back-gate electrode contact reaching the conductive layer of the back gate electrode and a gate electrode contact reaching the conductive layer of the gate electrode.

12. The method according to claim 11, wherein the lower semiconductor layer and the upper semiconductor layer are formed of silicon.

13. The method according to claim 12, wherein the lower semiconductor layer is formed by depositing polysilicon doped with an impurity being donor, and the upper semiconductor layer is formed by depositing polysilicon doped with an impurity being acceptor.

14. The method according to claim 11, wherein the conductive layer is formed of tungsten silicide, titanium silicide, or nickel silicide.

15. The method according to claim 11, further comprising:

removing the stacked body from the peripheral circuit section; and forming an interlayer insulating film in both the cell array section and the peripheral circuit section to cover a periphery of the stacked body remaining in the cell array section, the forming the stacked body including stacking the insulating films and the electrode films in both the cell array section and the peripheral circuit section, the forming the back-gate electrode contact and the gate electrode contact including:

forming a contact hole piercing the interlayer insulating film and the upper semiconductor layer; and filling a conductive material into the contact hole.

\* \* \* \* \*